US012615910B2

(12) United States Patent
Kim et al.

(10) Patent No.: US 12,615,910 B2
(45) Date of Patent: Apr. 28, 2026

(54) ORGANIC LIGHT EMITTING DIODE AND ORGANIC LIGHT EMITTING DEVICE

(71) Applicant: LG Display Co., Ltd., Seoul (KR)

(72) Inventors: Seung-Hyun Kim, Paju-si (KR); Young-Kwan Jung, Paju-si (KR); Hee-Yeol Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 432 days.

(21) Appl. No.: 18/481,709

(22) Filed: Oct. 5, 2023

(65) Prior Publication Data

US 2024/0215295 A1 Jun. 27, 2024

(30) Foreign Application Priority Data

Dec. 19, 2022 (KR) ........................ 10-2022-0178101

(51) Int. Cl.

| | |
|---|---|
| ***H10K 50/818*** | (2023.01) |
| ***H10K 50/125*** | (2023.01) |
| ***H10K 50/15*** | (2023.01) |
| ***H10K 50/16*** | (2023.01) |
| *H10K 102/00* | (2023.01) |

(52) U.S. Cl.

CPC ......... *H10K 50/818* (2023.02); *H10K 50/125* (2023.02); *H10K 50/15* (2023.02); *H10K 50/166* (2023.02); *H10K 2102/351* (2023.02)

(58) Field of Classification Search

CPC .... H10K 50/818; H10K 50/125; H10K 50/15; H10K 50/166

See application file for complete search history.

(56) References Cited

U.S. PATENT DOCUMENTS

| | | | | |
|---|---|---|---|---|
| 12,274,161 | B2 * | 4/2025 | Kim | H10K 85/00 |
| 2013/0082246 | A1 | 4/2013 | Hasegawa | |
| 2016/0126500 | A1 | 5/2016 | Uesaka et al. | |
| 2024/0206214 | A1 * | 6/2024 | Ahn | H10K 50/13 |
| 2025/0318432 | A1 * | 10/2025 | Yoon | C07B 59/002 |

* cited by examiner

*Primary Examiner* — Joseph L Williams

(74) *Attorney, Agent, or Firm* — Fenwick & West LLP

(57) ABSTRACT

An organic light emitting diode (OLED) and an organic light emitting device comprising the OLED (e.g., a display device or a lighting device) are described. The OLED includes a plurality of emitting parts each of which can include an emitting material layer between two electrodes. Each of the emitting material layers is spaced apart from each other or from the electrodes. As the distances among the electrodes and the emitting material layers and/or among emitting material layers are controlled, the OLED can secure sufficient amount of light emission as well as beneficial luminous efficiency and wide viewing angle.

25 Claims, 15 Drawing Sheets

D

ORGANIC LIGHT EMITTING DIODE AND ORGANIC LIGHT EMITTING DEVICE

CROSS-REFERENCE TO RELATED APPLICATION

This application claims priority, under 35 U.S.C. § 119(a), to Republic of Korea Patent Application No. 10-2022-0178101, filed in the Republic of Korea on Dec. 19, 2022, which is hereby incorporated by reference in its entirety.

BACKGROUND

Technical Field

The present disclosure relates to an organic light emitting diode, and more particularly to, an organic light emitting diode (OLED) that can have improved luminous efficiency and/or luminous luminance, as well as to an organic light emitting device including the OLED (e.g., a display device or a lighting device).

Description of the Related Art

Flat panel display devices including an organic light emitting diode (OLED), have been investigated as display devices that can replace a liquid crystal display device (LCD). The OLED can be formed as a thin organic film and the electrode configurations can implement unidirectional or bidirectional images. Also, the OLED can be formed even on a flexible transparent substrate such as a plastic substrate so that a flexible or a foldable display device can be realized with ease using the OLED. In addition, the OLED can be driven at a lower voltage and the OLED has advantageous high color purity compared to the LCD.

However, there remains a need to develop OLEDs and devices thereof that have improved luminous efficiency and luminous lifespan. Since fluorescent materials use only singlet excitons in the luminous process, the related art fluorescent material shows low luminous efficiency. Meanwhile, phosphorescent materials can show high luminous efficiency since they use triplet exciton as well as singlet excitons in the luminous process. But, examples of such phosphorescent material include metal complexes, which can have a short luminous lifespan for commercial use. As such, there remains a need to develop an OLED with sufficient luminous efficiency and luminous lifespan.

SUMMARY

Accordingly, embodiments of the present disclosure are directed to an organic light emitting diode and an organic light emitting device that substantially obviate one or more of the problems due to the limitations and disadvantages of the related art.

An object of the present disclosure is to provide an organic light emitting diode that can reduce energy loss caused by surface plasmon-polariton, as well as an organic light emitting device including the diode.

Another object of the present disclosure is to provide an organic light emitting diode that can increase cavity effect as well as can have improved luminous efficiency and luminous lifespan, as well as an organic light emitting device including the diode.

Another object of the present disclosure is to provide an organic light emitting diode that can have beneficial viewing angle, as well as an organic light emitting device including the diode.

Additional features and aspects will be set forth in the description that follows, and in part will be apparent from the description, or can be learned by practice of the disclosed concepts provided herein. Other features and aspects of the disclosed concept can be realized and attained by the structure particularly pointed out in the written description, or derivable therefrom, and the claims hereof as well as the appended drawings.

To achieve these and other advantages and in accordance with objects of the disclosure, as embodied and broadly described herein, in one aspect, the present disclosure provides an organic light emitting diode comprising: a reflective electrode; a transmissive electrode facing the reflective electrode; and an emissive layer between the reflective electrode and the transmissive electrode, the emissive layer including: a first emitting part between the reflective electrode and the transmissive electrode, the first emitting part comprising a first emitting material layer; a second emitting part between the first emitting part and the transmissive electrode, the second emitting part comprising a second emitting material layer; a third emitting part between the second emitting part and the transmissive electrode, the third emitting part comprising a third emitting material layer; a first charge generation layer between the first emitting part and the second emitting part; and a second charge generation layer between the second emitting part and the third emitting part, wherein a first distance from a top surface of the reflective electrode to a bottom surface of the first emitting material layer, a second distance from the bottom surface of the first emitting material layer to a bottom surface of the second emitting material layer, a third distance from the bottom surface of the second emitting material layer to a bottom surface of the third emitting material layer, and a fourth distance from the bottom surface of the third emitting material layer to a bottom surface of the transmissive electrode have a ratio of 3.0 to 3.75:1:2.0 to 2.75:1.5 to 2.25.

In one embodiment, an organic light emitting diode comprises: a reflective electrode; a transmissive electrode facing the reflective electrode; and an emissive layer between the reflective electrode and the transmissive electrode, the emissive layer including: a first emitting part between the reflective electrode and the transmissive electrode, the first emitting part comprising a first emitting material layer; a second emitting part between the first emitting part and the transmissive electrode; a third emitting part disposed between the second emitting part and the transmissive electrode; a first charge generation layer between the first emitting part and the second emitting part; and a second charge generation layer between the second emitting part and the third emitting part, wherein a distance between a top surface of the reflective electrode and a bottom surface of the first emitting material layer is in a range between 1400 Å and 1500 Å.

In one embodiment, an organic light emitting diode comprises: a reflective electrode; a first emitting part on the reflective electrode, the first emitting part comprising a first emitting material layer configured to emit blue light; a first charge generation layer on the first emitting part; a second emitting part on the first charge generation layer, the second emitting part including a second emitting material layer comprising a red emitting material layer configured to emit red light and a green emitting material layer configured to emit green light, the green emitting material layer on the red emitting material layer; a second charge generation layer on the second emitting part; a third emitting part on the second charge generation layer, the third emitting part including a third emitting material layer configured to emit the blue light; and a transmissive electrode on the third emitting part, wherein a distance between a top surface of the reflective electrode and a bottom surface of the first emitting material layer is in a range between 1400 Å and 1500 Å.

In one or more embodiments, the OLED includes a plurality of emitting parts to have a tandem structure between the reflective electrode and the transmissive electrode. In the OLED, the distances among the electrode and the emitting material layers, among the emitting material layers and/or among the organic layers are controlled.

As the distance between the reflective electrode and the first emitting material layer is controlled, energy loss owing to surface plasmon-polariton (SPP) in the OLED can be reduced. As the distance between the first emitting material layer and the second emitting material layer and/or between the reflective electrode and the transmissive electrode are controlled, the OLED can increase cavity effect and can secure stable luminous lifespan. As the distance between the second emitting material layer and the third emitting material layer and/or between the third emitting material layer and the transmissive electrode are controlled, the OLED can improve viewing angle and can secure beneficial electrical and/or optical properties.

Therefore, it is possible to realize an OLED as well as an organic light emitting device with beneficial luminous efficiency, luminous intensity and luminance.

It is to be understood that both the foregoing general description and the following detailed description are merely by way of example and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. In the following description, when a detailed description of well-known functions or configurations related to this document is determined to unnecessarily cloud a gist of the inventive concept, the detailed description thereof will be or may be omitted. The progression of processing steps and/or operations described is an example; however, the sequence of steps and/or operations is not limited to that set forth herein and can be changed as is known in the art, with the exception of steps and/or operations necessarily occurring in a particular order. Names of the respective elements used in the following explanations are selected only for convenience of writing the specification and can be thus different from those used in actual products. Further, all the components of each organic light emitting diode (OLED) and each organic light emitting device (e.g., display device, illumination device, etc.) using the OLED according to all embodiments of the present disclosure are operatively coupled and configured.

The present disclosure relates to an organic light emitting diode and/or an organic light emitting device where the distances among the electrodes, among the organic layers in the emissive layer and/or among the electrode and the organic layers were controlled, and therefore, with improving luminous properties. As an example, the emissive layer can be applied to an organic light emitting diode of a tandem structure with stacking two or more emitting parts. The organic light emitting diode can be applied to an organic light emitting device such as an organic light emitting display device or an organic light emitting illumination device.

Figure 1:
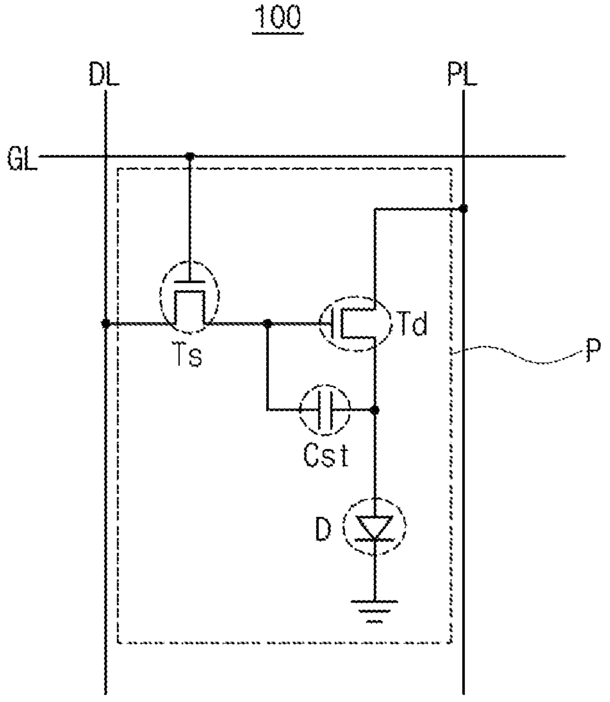
FIG. 1 illustrates a schematic circuit diagram of an organic light emitting display device according to one or more embodiments of the present disclosure.

FIG. 1 illustrates a schematic circuit diagram of an organic light emitting display device in accordance with one or more embodiments of the present disclosure.

Figure 2:
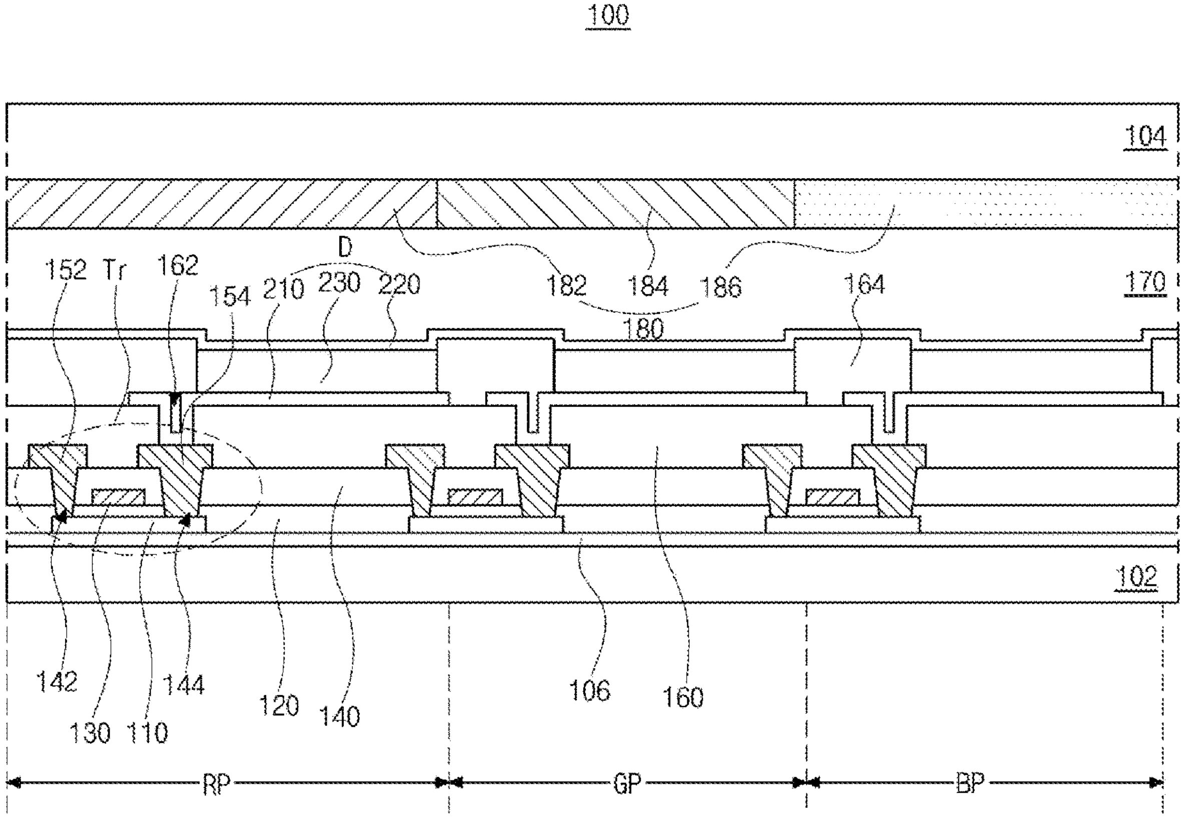
FIG. 2 illustrates a cross-sectional view of an organic light emitting display device as an example of an organic light emitting device in accordance with an example embodiment of the present disclosure.

As illustrated in FIG. 1, a gate line GL, a data line DL and a power line PL, each of which crosses each other to define a pixel region P, are provided in an organic light emitting display device 100 (FIG. 2). A switching thin film transistor Ts, a driving thin film transistor Td, a storage capacitor Cst and an organic light emitting diode D are disposed within the pixel region P. The pixel region P can include a red (R) pixel region, a green (G) pixel region and a blue (B) pixel region. However, embodiments of the present disclosure are not limited to such examples. The organic light emitting display device 100 includes a plurality of such pixel regions P which can be arranged in a matrix configuration or other configurations.

The switching thin film transistor Ts is connected to the gate line GL and the data line DL. The driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied to the gate line GL, a data signal applied to the data line DL is applied to a gate electrode of the driving thin film transistor Td and one electrode of the storage capacitor Cst through the switching thin film transistor Ts.

The driving thin film transistor Td is turned on by the data signal applied to a gate electrode 130 (FIG. 2) so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

FIG. 2 illustrates a schematic cross-sectional view of an organic light emitting display device in accordance with an embodiment of the present disclosure. The pixel circuit configuration of FIG. 1 can be used in the display device of FIG. 2 or other figures of the present application.

As illustrated in FIG. 2, the organic light emitting display device 100 includes a first substrate 102 that defines each of a red pixel region RP, a green pixel region GP and a blue pixel region BP, a second substrate 104 facing the first substrate 102, a thin film transistor Tr on the first substrate 102, an organic light emitting diode (OLED) D disposed between the first and second substrates 402 and 404 and configured to emit white (W) light, and a color filter layer 180 disposed between the OLED D and the second substrate 104. The organic light emitting display device 100 can include a plurality of such pixel regions arranged in a matrix configuration or other suitable configurations.

Each of the first substrate 102 and the second substrate 104 can include, but is not limited to, glass, flexible material and/or polymer plastics. For example, each of the first and second substrates 102 and 104 can be made of, but is not limited to, polyimide (PI), polyethersulfone (PES), polyethylenenaphthalate (PEN), polyethylene terephthalate (PET), polycarbonate (PC) and/or combinations thereof. The first substrate 102, on which a thin film transistor Tr and the OLED D are arranged, forms an array substrate. In certain embodiments, the second substrate 104 can be omitted.

A buffer layer 106 can be disposed on the first substrate 102. The thin film transistor Tr can be disposed on the buffer layer 106 correspondingly to each of the red pixel region RP, the green pixel region GP and the blue pixel region BP. In certain embodiments, the buffer layer 106 can be omitted.

A semiconductor layer 110 is disposed on the buffer layer 106. In one embodiment, the semiconductor layer 110 can include, but is not limited to, oxide semiconductor materials. In this case, a light-shield pattern can be disposed under the semiconductor layer 110, and the light-shield pattern can prevent light from being incident toward the semiconductor layer 110, thereby, preventing or reducing the semiconductor layer 110 from being degraded by the light. Alternatively, the semiconductor layer 110 can include polycrystalline silicon. In this case, opposite edges of the semiconductor layer 110 can be doped with impurities.

A gate insulating layer 120 including an insulating material is disposed on the semiconductor layer 110. The gate insulating layer 120 can include, but is not limited to, an inorganic insulating material such as silicon oxide ($SiO_x$, wherein $0<x\leq 2$) or silicon nitride ($SiN_x$, wherein $0<x\leq 2$).

A gate electrode 130 made of a conductive material such as a metal is disposed on the gate insulating layer 120 so as to correspond to a center of the semiconductor layer 110. While the gate insulating layer 120 is disposed on the entire area of the substrate 102 as shown in FIG. 2, the gate insulating layer 120 can be patterned identically as the gate electrode 130.

An interlayer insulating layer 140 including an insulating material is disposed on the gate electrode 130 and covers an entire surface of the substrate 102. The interlayer insulating layer 140 can include, but is not limited to, an inorganic insulating material such as silicon oxide ($SiO_x$, wherein $0<x\leq 2$) or silicon nitride ($SiN_x$, wherein $0<x\leq 2$), or an organic insulating material such as benzocyclobutene or photo-acryl.

The interlayer insulating layer 140 has first and second semiconductor layer contact holes 142 and 144 that expose or do not cover a portion of the surface nearer to the opposing ends than to a center of the semiconductor layer 110. The first and second semiconductor layer contact holes 142 and 144 are disposed on opposite sides of the gate electrode 130 and spaced apart from the gate electrode 130. The first and second semiconductor layer contact holes 142 and 144 are formed within the gate insulating layer 120 in FIG. 2. Alternatively, in certain embodiments, the first and second semiconductor layer contact holes 142 and 144 can be formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other on opposing sides of the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed on the semiconductor layer 110. Alternatively, the thin film transistor Tr can have an inverted staggered structure in which a gate electrode is disposed under a semiconductor layer and a source and drain electrodes are disposed on the semiconductor layer. In this case, the semiconductor layer can include amorphous silicon.

The gate line GL and the data line DL, which cross each other to define a pixel region P, and a switching element Ts, which is connected to the gate line GL and the data line DL, can be further formed in the pixel region P. The switching element Ts is connected to the thin film transistor Tr, which is a driving element. In addition, the power line PL is spaced apart in parallel from the gate line GL or the data line DL. The thin film transistor Tr can further include a storage capacitor Cst configured to constantly keep a voltage of the gate electrode 130 for one frame.

A passivation layer 160 is disposed on the source and drain electrodes 152 and 154 and covers the thin film transistor Tr over the whole first substrate 102. The passivation layer 160 has a flat top surface and a drain contact hole (or a contact hole) 162 that exposes or does not cover the drain electrode 154 of the thin film transistor Tr. While the drain contact hole 162 is disposed on the second semiconductor layer contact hole 144, it can be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is formed for each pixel region RP, GP or BP. The first electrode 210 can be an anode and include conductive material having relatively high work function value. For example, the first electrode 210 can include a transparent conductive oxide (TCO). In an embodiment, the first electrode 210 can include, but is not limited to, indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and/or combinations thereof.

In one embodiment, when the organic light emitting display device 100 is a bottom-emission type, the first electrode 210 can have a single-layered structure of the TCO. Alternatively, when the organic light emitting display device 100 is a top-emission type, a reflective electrode or a reflective layer can be disposed under the first electrode 210. For example, the reflective electrode or the reflective layer can include, but is not limited to, silver (Ag) or aluminum-palladium-copper (APC) alloy. For example, in the OLED D of the top-emission type, the first electrode 210 can have, but is not limited to, a triple-layered structure of ITO/Ag/ITO or ITO/APC/ITO.

In addition, a bank layer 164 is disposed on the passivation layer 160 in order to cover edges of the first electrode 210. The bank layer 164 exposes or does not cover a center of the first electrode 210 corresponding to each of the red pixel region RP, the green pixel region GP and the blue pixel region BP. In certain embodiments, the bank layer 164 can be omitted.

Figure 3:
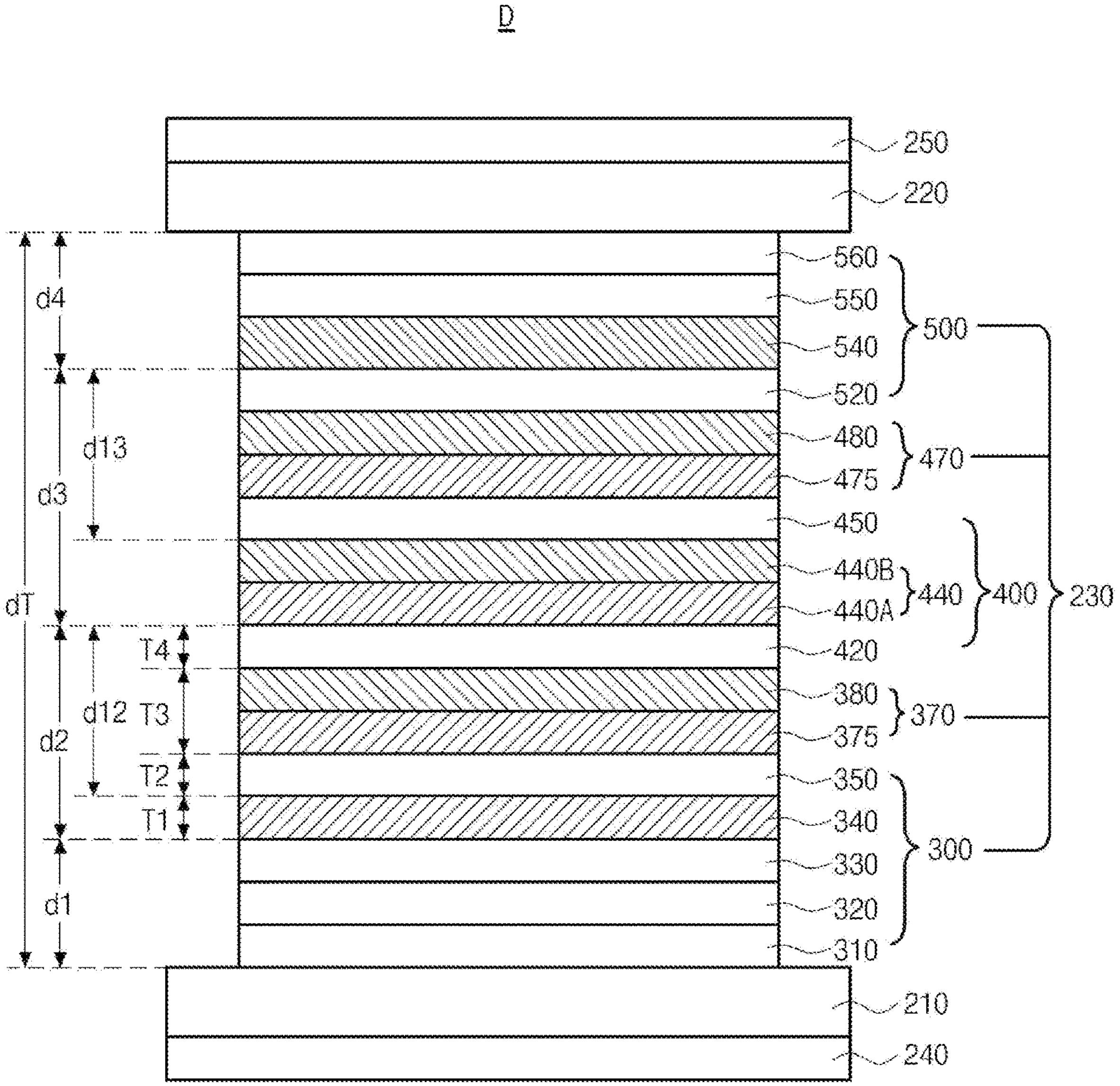
FIG. 3 illustrates a cross-sectional view of an organic light emitting diode having a plurality of emitting parts in accordance with an example embodiment of the present disclosure.

The emissive layer 230 is disposed on the first electrode 210. The emissive layer 230 can include at least one emitting part. For example, as illustrated in FIG. 3, the emissive layer 230 can include a plurality of emitting parts 300, 400, and 500 and a plurality of charge generation layers 370 and 470. In one embodiment, each of the emitting parts 300, 400, and 500 can have a single-layered structure of an emitting material layer (EML).

In another embodiment, each of the emitting parts 300, 400, and 500 in the emissive layer 230 can have a multiple-layered structure of a hole injection layer (HIL), a hole transport layer (HTL), an electron blocking layer (EBL), an EML, a hole blocking layer (HBL), an electron transport layer (ETL), an electron injection layer (EIL).

The emissive layer 230 can have multiple emitting parts to form a tandem structure. For example, the emissive layer 230 can be applied to an organic light emitting diode of a tandem structure stacked multiple emitting parts, located at each of the red pixel region RP, the green pixel region GP and the blue pixel region BP.

The distances among the first electrode 210 and the emitting material layers and/or the distances among the organic layers including the emitting material layers are controlled, and thus, the luminous efficiency, luminance and/or the luminous lifespan of the OLED D can be improved and the OLED D can secure beneficial color viewing angle.

The second electrode 220 is disposed on the first substrate 102 above which the emissive layer 230 is disposed. The second electrode 220 can be disposed on the entire display area. The second electrode 220 can include a conductive material with a relatively low work function value compared to the first electrode 210. The second electrode 220 can be a cathode providing electrons. For example, the second electrode 220 can include highly reflective material such as aluminum (Al), magnesium (Mg), calcium (Ca), silver (Ag), alloy thereof and/or combinations thereof such as aluminum-magnesium alloy (Al—Mg). In one embodiment, the second electrode 220 can be a transmissive electrode. In this case, the second electrode 220 can include, but is not limited to, ITO, IZO, ITZO, SnO, ZnO, ICO and/or AZO.

In addition, an encapsulation film 170 can be disposed on the second electrode 220 in order to prevent or reduce outer moisture from penetrating into the OLED D. The encapsulation film 170 can have, but is not limited to, a laminated structure of a first inorganic insulating film, an organic insulating film and a second inorganic insulating film. In certain embodiments, the encapsulation film 170 can be omitted.

The organic light emitting display device 100 can further include a polarizing plate to reduce reflection of external light. For example, the polarizing plate can be a circular polarizing plate. When the organic light emitting display device 100 is a bottom-emission type, the polarizing plate can be disposed under the first substrate 102. When the organic light emitting display device 100 is a top-emission type, the polarizing plate can be disposed on the encapsulation film 170 or the second electrode 230. In addition, a cover window can be attached to the encapsulation film 170 or the polarizing plate. In this case, the first substrate 102, the second substrate 104 and the cover window can have a flexible property, thus the organic light emitting display device 100 can be a flexible display device.

The color filter layer 180 is disposed on the OLED D. The color filter layer 180 can include a red color filter pattern 182, a green color filter pattern 184, and a blue color filter pattern 186 each of which is disposed correspondingly to the red pixel region RP, the green pixel region GP and the blue pixel region BP, respectively. In one embodiment, the color filter layer 180 can be attached to the OLED D by adhesive layer. Alternatively or additionally, the color filter layer 180 can be disposed directly on the OLED D.

In the organic light emitting display device 100, the light emitted from the emissive layer 230 is incident to the color filter layer 180 through the second electrode 220, and the color filter layer 180 is disposed on the OLED D. The organic light emitting display device 100 can be a top-emission type. Alternatively, when the organic light emitting display device 100 is a bottom-emission type, the light emitted from the OLED D is transmitted through the first electrode 210, and the color filter layer 180 can be disposed between the OLED D and the first substrate 102.

In addition, a color conversion layer can be formed or disposed between the OLED D and the color filter layer 180. The color conversion layer can include a red color conversion layer, a green color conversion layer and a blue color conversion layer each of which is disposed correspondingly to each pixel region (RP, GP and BP), respectively, so as to convert the white (W) color light to each of a red, green and blue color lights, respectively. For example, the color conversion layer can include quantum dots so that the color purity of the organic light emitting display device 100 can be further improved. Alternatively, the organic light emitting display device 100 can comprise the color conversion layer instead of the color filter layer 180.

The OLED D with a plurality of emitting parts is described in more detail. FIG. 3 illustrates a schematic cross-sectional view of an organic light emitting diode having a plurality of emitting parts in accordance with an embodiment of the present disclosure. For instance, FIG. 3 shows an example (OLED D) of the OLED D in FIGS. 1 and 2.

As illustrated in FIG. 3, the organic light emitting diode (OLED) D in accordance with an example of the present disclosure includes a first electrode 210, a second electrode 220 facing the first electrode 210, and an emissive layer 230 disposed between the first electrode 210 and the second electrode 220. The OLED D can further include a reflector 240 disposed at least under the first electrode 210 and/or a capping layer (CPL) 250 disposed on the second electrode 220.

The organic light emitting display device 100 includes the red pixel region RP, the green pixel region GP and the blue pixel region BP, and the OLED D can be disposed in the red pixel region RP, the green pixel region GP and the blue pixel region BP.

One of the first electrode 210 and the second electrode 220 can be an anode and the other of the first electrode 210 and the second electrode 220 can be a cathode. For example, the first electrode 210 can be the anode and the second electrode 220 can be the cathode. The first electrode 210 can includes transparent conductive oxide and include the reflector 240 that can be made of silver or APC alloy at least under thereof. The first electrode 210 and the reflector 240 can constitute reflective electrode. The second electrode 220 can include the transparent conductive oxide and can be a transmissive electrode.

The reflector 240 can have a thickness within, but is not limited to, a range of 500 Å to 1500 Å, for example a range of 700 Å to 1200 Å. The first electrode 210 can have a thickness within, but is not limited to, a range of 50 Å to 200 Å, for example, a range of 50 Å to 150 Å. The second electrode 220 can have a thickness within, but is not limited to, a range of 200 Å to 400 Å, for example, a range of 250 Å to 350 Å. The CPL 250 can have a thickness within, but is not limited to, a range of 900 Å to 1200 Å, for example, a range of 1000 Å to 1100 Å.

The emissive layer 230 can include a first emitting part 300 disposed between the first electrode 210 and the second electrode 220, a second emitting part 400 disposed between the first emitting part 300 and the second electrode 220, a third emitting part 500 disposed between the second emitting part 400 and the second electrode 220, a first charge generation layer (CGL1) 370 disposed between the first emitting part 300 and the second emitting part 400, and a second charge generation layer (CGL2) 470 disposed between the second emitting part 400 and the third emitting part 500.

The first emitting part 300 includes a first emitting material layer (EML1) 340. The first emitting part 300 can include at least one of a hole injection layer (HIL) 310 disposed between the first electrode 210 and the EML1 340, a first hole transport layer (HTL1) 320 disposed between the HIL 310 and the EML1 340, a second hole transport layer (HTL2) 330 disposed between the HTL1 320 and the EML1 340, and a first electron transport layer (ETL1) 350 disposed between the EML1 340 and the CGL1 370.

The second emitting part 400 includes a second emitting material layer (EML2) 440. The second emitting part 400 can include at least one of a third hole transport layer (HTL3) 420 disposed between the CGL1 370 and the EML2 440 and a second electron transport layer (ETL2) 450 disposed between the EML2 440 and the CGL2 470.

The third emitting part 500 includes a third emitting material layer (EML3) 540. The third emitting part 500 can include at least one of a fourth hole transport layer (HTL4) 520 disposed between the CGL2 470 and the EML3 540, a third electron transport layer (ETL3) 550 disposed between the EML3 540 and the second electrode 220 and an electron injection layer (EIL) 560 disposed between the ETL3 550 and the second electrode 220.

In one embodiment, two of the EML1 to EML3 340, 440 and 540 emit blue color light and another of the EML1 to EML3 340, 440 and 540 emits red to green color light so that the OLED D can implement white color emission. Hereinafter, the OLED D where the EML1 340 and the EML3 540 emit blue color light and the EML2 440 emits red to green color light will be described in more detail.

The HIL 310 is disposed between the first electrode 210 and the HTL1 320 and can improve an interface property between the inorganic first electrode 210 and the organic HTL1 320. In one embodiment, hole injecting material in the HIL 310 can include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino)triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), N,N'-Bis{4-[bis(3-methylphenyl)amino]phenyl}-N,N'-diphenyl-4,4'-biphenyldiamine (DNTPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 2,3,5,6-Tetrafluoro-7,7,8,8-tetracyanoquinodimethane (F4-TCNQ), 1,3,4,5,7,8-hexafluorotetracyano-naphthoquinodimethane (F6-TCNNQ), 1,3,5-tris[4-(diphenylamino)phenyl]benzene (TDAPB), poly(3,4-ethylenedioxythiphene)polystyrene sulfonate (PEDOT/PSS), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB), Di-[4-(N,N-di-p-tolyl-amino)-phenyl]cyclohexane (TAPC), N4,N4,N4',N4'-Tetra[(1,1'-biphenyl)-4-yl]-(1,1'-biphenyl)-4,4'-diamine (BPBPA), the organic compound of the following Chemical Formula 1 and/or combinations thereof.

[Chemical Formula 1]

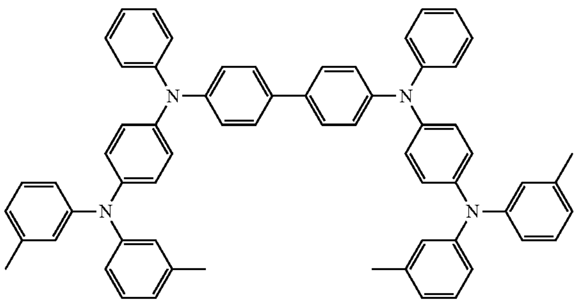

In another embodiment, the HIL 310 can include hole transporting material described below doped with the above hole injecting material (e.g., organic material such as HAT-CN, F4-TCNA and/or F6-TCNNQ). In this case, the contents of the hole injecting material in the HIL 310 can be, but is not limited to, about 2 wt % to about 15 wt %. In certain embodiments, the HIL 310 can be omitted in compliance of the OLED D property.

Each of the HTL1 and HTL2 320 and 330, the HTL2 420, and the HTL4 520 transports holes to the EML1 340, the EML2 440 and the EML3 540, respectively. In one embodiment, the hole transporting material in the HTL1 to HTL4 320, 330, 420 and 520 can independently include, but is not limited to, N,N'-Diphenyl-N,N'-bis(3-methylphenyl)-1,1'-biphenyl-4,4'-diamine (TPD), NPB(NPD), 4,4'-bis(N-carbazolyl)-1,1'-biphenyl (CBP), DNTPD, BPBPA, NPNPB, Poly[N,N'-bis(4-butylphenyl)-N,N'-bis(phenyl)-benzidine] (Poly-TPD), Poly[(9,9-dioctylfluorenyl-2,7-diyl)-co-(4,4'-(N-(4-sec-butylphenyl)diphenylamine))] (TFB), TAPC, 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine and/or combinations thereof.

In another embodiment, the HTL2 320 disposed adjacently to the EML1 (first blue emitting material layer) 340 can act as electron blocking together with or instead of the hole transporting function. When the HTL2 330 has the electron blocking function, electron blocking material in the HTL2 330 can independently include, but is not limited to, TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-Bis(carbazol-9-yl)benzene (mCP), 3,3-Di(9H-carbazol-9-yl)biphenyl (mCBP), CuPc, DNTPD, TDABP, DCDPA, 2,8-bis(9-phenyl-9H-carbazol-3-yl)dibenzo[b,d]thiophene and/or combinations thereof.

Each of the ETL1 350, the ETL2 450 and the ETL3 550 transports electrons to the EML1 340, the EML2 440 and the EML3 540, respectively. In one embodiment, electron transporting material in the ETL1 to ETL3 350, 450 and 550 can independently include at least one of an oxadiazole-based compound, a triazole-based compound, a phenanthroline-based compound, a benzoxazole-based compound, a benzothiazole-based compound, a benzimidazole-based compound, and a triazine-based compound.

For example, the electron transporting material in the ETL1 to ETL3 350, 450 and 550 can independently include, but is not limited to, tris-(8-hydroxyquinoline) aluminum ($Alq_3$), 2-biphenyl-4-yl-5-(4-t-butylphenyl)-1,3,4-oxadiazole (PBD), spiro-PBD, lithium quinolate (Liq), 2,2',2"-(1,3,5-benzenetriyl)-tris(1-phenyl-1-H-benzimidazole) (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis(naphthalene-2-yl)4,7-diphenyl-1,10-phenanthroline (NBphen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl) biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] dibromide (PFNBr), tris(phenylquinoxaline) (TPQ), Diphenyl-4-triphenylsilyl-phenylphosphine oxide (TSPO1), 2-[4-(9,10-Di-2-naphthalen2-yl-2-anthracen-2-yl)phenyl]-1-phenyl-1H-benzimidazole (ZADN), and/or combinations thereof.

The EIL 560 is disposed between the second electrode 220 and the ETL3 550, and can improve physical properties of the second electrode 220 and therefore, can enhance the lifespan of the OLED D. In one embodiment, electron injecting material in the EIL 560 can include, but is not limited to, an alkali metal halide and/or an alkaline earth metal halide such as LiF, CsF, NaF, $BaF_2$ and the like, and/or an organometallic Compound such as Liq, lithium benzoate, sodium stearate, and the like. In certain embodiments, the EIL 660 can be omitted.

In another embodiment, the ETL3 550 and the EIL 560 can have a single layered structure. In this case, the above electron transporting material and/or the electron injecting material can be mixed with each other. As an example, the ETL3 550/EIL 660 can include two or more different electron transporting materials. For example, two electron transporting materials in the ETL/EIL are admixed with a weight ratio of 3:7 to 7:3, but is not limited thereto.

The EML1 340 and the EML3 540 can be a first blue emitting material layer and a second blue emitting material layer, respectively. Each of the EML1 340 and the EML3 540 can be a blue EML, a sky-blue EML or a deep-blue EML. Each of the EML1 340 and the EML3 540 can independently include a blue host and a blue emitter (blue dopant).

The blue host can include at least one of a P-type blue host and an N-type blue host. The P-type blue host can include, but is not limited to, a carbazole-based organic compound, an amine-based organic compound substituted with aryl and/or hetero aryl and/or a spirofluorene-based organic compound. The N-type blue host can include, but is not limited to, an azine-based organic compound.

In one embodiment, the blue host can include, but is not limited to, mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), Diphenyl-4-triphenylsilyl-phenylphosphine oxide (TSPO1), 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spiorobifluoren-2-yl-diphenyl-phosphine oxide (SPPO1), 9,9'-(5-(Triphenylsilyl)-1,3-phenylene)bis(9H-carbazole) (SimCP), 9,10-di(naphthalen-2-yl)anthracene (ADN), 2-methyl-9,10-bis(naphthalen-2-yl)anthracene (MADN) and/or combinations thereof.

The blue emitter can include at least one of blue phosphorescent material, blue fluorescent material and blue delayed fluorescent material. In one embodiment, the blue emitter can include, but is not limited to, perylene, 4,4'-Bis[4-(di-p-tolylamino)styryl]biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spirofluorene (spiro-DPVBi), [1,4-bis[2-[4-[N,N-di(p-tolyl)amino] phenyl]vinyl]benzene (DSB), 1-4-di-[4-(N,N-diphenyl) amino]styryl-benzene (DSA), 2,5,8,11-Tetra-tetr-butylperylene (TBPe), Bis((2-hydroxylphenyl)-pyridine) beryllium ($Bepp_2$), 9-(9-Phenylcarbazol-3-yl)-10-(naphthalen-1-yl)anthracene (PCAN), mer-Tris(1-phenyl-3-methylimidazolin-2-ylidene-C,C(2))'iridium(III) (mer-Ir $(pmi)_3$), fac-Tris(1,3-diphenyl-benzimidazolin-2-ylidene-C,C(2))'iridium(III) (fac-Ir$(dpbic)_3$), Bis(3,4,5-trifluoro-2-(2-pyridyl)phenyl-(2-carboxypyridyl))iridium(III) (Ir(tfpd)$_2$pic), tris(2-(4,6-difluorophenyl)pyridine)iridium(III) (Ir $(Fppy)_3$), Bis[2-(4,6-difluorophenyl)pyridinato-$C^2$,N] (picolinato)iridium(III) (FIrpic), DABNA-1, DABNA-2, t-DABNA, v-DABNA and/or combinations thereof.

The blue host in the EML1 340 can be identical to or different from the blue host in the EML3 540. The blue emitter in the EML1 340 can be identical to or different from the blue emitter in the EML3 540.

The contents of the blue host in the EML1 and EML3 340 and 540 can be in a range between 50 wt % and 99 wt %, for example, 80 wt % and 95 wt %, and the contents of the blue emitter in the EML1 and EML3 340 and 540 can be in a range between 1 wt % and 50 wt %, for example, 5 wt % and 20 wt %, but is not limited thereto. When the EML1 and EML3 340 and 540 includes both the P-type blue host and the N-type blue host, the P-type blue host and the N-type blue host can be mixed, but is not limited to, with a weight ratio between 4:1 to 1:4, for example, 3:1 to 1:3.

The EML2 440 can be a red-green emitting material layer. The EML2 440 can include a first layer (middle lower emitting material layer) 440A disposed between the HTL3 420 and the ETL2 450 and a second layer (middle upper emitting material layer) 440B disposed between the first layer 440A the ETL2 450. One of the first layer 440A and the second layer 440B can be a green emitting material layer and the other of the first layer 440A and the second layer 440B can be a red emitting material layer. Hereinafter, the OLED D where the first layer 440A is a green emitting material layer and the second layer 440B is a red emitting material layer will be described in detail.

The first layer 440A can include a green host and a green emitter (green dopant). The green host can include at least one of a P-type green host and an N-type green host. The P-type green host can include, but is not limited to, a carbazole-based organic compound, an amine-based organic compound substituted with aryl and/or hetero aryl and/or a spirofluorene-based organic compound. The N-type green host can include, but is not limited to, an azine-based organic compound.

In one embodiment, the green host include, but is not limited to, mCP-CN, CBP, mCBP, mCP, Bis[2-(diphenylphosphino)phenyl]ether oxide (DPEPO), 2,8-bis(diphenylphosphoryl)dibenzothiophene (PPT), 1,3,5-Tris[(3-pyridyl)-phen-3-yl]benzene (TmPyPB), 2,6-Di(9H-carbazol-9-yl)pyridine (PYD-2Cz), 2,8-di(9H-carbazol-9-yl)dibenzothiophene (DCzDBT), 3',5'-Di(carbazol-9-yl)-[1,1'-biphenyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicarbazole, 9,9'-Diphenyl-9H,9'H-3,3'-bicarbazole (BCzPh), 1,3,5-Tris(carbazol-9-yl)benzene (TCP), TCTA, 4,4'-Bis(carbazole-9-yl)-2,2'-dimethylbiphenyl (CDBP), 2,7-Bis(carbazole-9-yl)-9,9-dimethylfluorene (DMFL-CBP), 2,2',7,7'-Tetrakis(carbazol-9-yl)-9,9-spirofluorene (Spiro-CBP), 3,6-Bis(carbazole-9-yl)-9-(2-ethyl-hexyl)-9H-carbazole (TCz1) and/or combinations thereof.

The green emitter can include at least one of green phosphorescent material, green fluorescent material and green delayed fluorescent material. In one embodiment, the green emitter can include, but is not limited to, [Bis(2-phenylpyridine)](pyridyl-2-benzofuro[2,3-b]pyridine) iridium, Tris[2-phenylpyridine]iridium(III) ($Ir(ppy)_3$), fac-Tris(2-phenylpyridine)iridium(III) (fac-$Ir(ppy)_3$), Bis(2-phenylpyridine)(acetylacetonate)iridium(III) ($Ir(ppy)_2$(acac)), Tris[2-(p-tolyl)pyridine]iridium(III) ($Ir(mppy)_3$), Bis(2-(naphthalene-2-yl)pyridine)(acetylacetonate)iridium (III) ($Ir(npy)_2$acac), Tris(2-phenyl-3-methyl-pyridine)iidium ($Ir(3mppy)_3$), fac-Tris(2-(3-p-xylyl)phenyl)pyridine iridium (III) (TEG) and/or combinations thereof.

The contents of the green host in the first layer 440A can be in a range between 50 wt % and 99 wt %, for example, between 80 wt % and 95 wt %, and the contents of the green emitter in the first layer 440A can be in a range between 1 wt % and 50 wt %, for example, between 5 wt % and 20 wt %, but is not limited thereto. When the first layer 440A includes both the P-type green host and the N-type green host, the P-type green host and the N-type green host can be mixed, but is not limited to, with a weight ratio between 4:1 to 1:4, for example, between 3:1 to 1:3.

The second layer 440B can be a red emitting material layer. The second layer 440B can include a red host and a red emitter (red dopant). The red host can include at least one of a P-type red host and an N-type red host. The P-type red host can include, but is not limited to, a carbazole-based organic compound, an amine-based organic compound substituted with aryl and/or hetero aryl and/or a spirofluorene-based organic compound. The N-type red host can include, but is not limited to, an azine-based organic compound, a quinazoline-based organic compound and/or a quinoxaline-based organic compound.

For example, the red host can include, but is not limited to, CBP, mCBP, 2,2'-Di(9H-carbazol-9yl)-1,1'-biphenyl (oCBP), mCP, mCP-CN, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, BCzPh, CDBP, DMFL-CBP, Spiro-CBP, TCz1, BPBPA, 1,3,5-Tris(N-phenylbenzimidazol-2-yl)benzene (TPBi), TCTA and/or combinations thereof.

The red emitter can include at least one of red phosphorescent material, red fluorescent material and red delayed fluorescent material. In one embodiment, the red emitter can include, but is not limited to, Bis[2-(4,6-dimethyl)phenylquinoline](2,2,6,6-tetramethylheptane-3,5-dionate) iridium(III), Bis[2-(4-n-hexylphenyl)quinoline](acetylacetonate)iridium(III) (Hex-$Ir(phq)_2$(acac)), Tris[2-(4-n-hexylphenyl)quinoline]iridium(III) (Hex-$Ir(phq)_3$), Tris[2-phenyl-4-methylquinoline]iridium(III) ($Ir(Mphq)_3$), Bis(2-phenylquinoline)(2,2,6,6-tetramethylheptene-3,5-dionate) iridium(III) ($Ir(dpm)PQ_2$), Tris(1-phenylisoquinoline) iridium(III) ($Ir(piq)_3$), Bis(phenylisoquinoline)(2,2,6,6-tetramethylheptene-3,5-dionate)iridium(III) ($Ir(dpm)(piq)_2$), Bis(1-phenylisoquinoline)(acetylacetonate)iridium(III) ($Ir(piq)_2$(acac)), Bis[(4-n-hexylphenyl)isoquinoline](acetylacetonate)iridium(III) (Hex-$Ir(piq)_2$(acac)), Tris[2-(4-n-hexylphenyl)quinoline]iridium(III) (Hex-$Ir(piq)_3$), Tris(2-(3-methylphenyl)-7-methyl-quinolato)iridium ($Ir(dmpq)_3$), Bis[2-(2-methylphenyl)-7-methyl-quinoline](acetylacetonate)iridium(III) ($Ir(dmpq)_2$(acac)), Bis[2-(3,5-dimethylphenyl)-4-methylquinoline](acetylacetonate)iridium(III) ($Ir(mphmq)_2$(acac)), Tris(dibenzoylmethane)mono(1,10-phenanthroline)europium(III) ($Eu(dbm)_3$(phen)) and/or combinations thereof.

The contents of the red host in the second layer 440B can be in a range between 50 wt % and 99 wt %, for example, between 80 wt % and 95 wt %, and the contents of the red emitter in the second layer 440B can be in a range between 1 wt % and 50 wt %, for example, between 5 wt % and 20 wt %, but is not limited thereto. When the second layer 440 B includes both the P-type red host and the N-type red host, the P-type red host and the N-type red host can be mixed, but is not limited to, with a weight ratio about 4:1 to 1:4, for example, between 3:1 to 1:3.

Alternatively or additionally, the EML2 440 can further include a third layer of a yellow-green emitting material layer disposed between the first layer 440A and the second layer 440B. The third layer can include a yellow-green host and a yellow-green emitter (yellow-green dopant).

The yellow-green host can include at least one of a P-type yellow-green host and an N-type yellow-green host. The P-type yellow-green host can include, but is not limited to, a carbazole-based organic compound, an amine-based organic compound substituted with aryl and/or hetero aryl and/or a spirofluorene-based organic compound. The N-type yellow-green host can include, but is not limited to, an azine-based organic compound, a quinazoline-based organic compound and/or a quinoxaline-based organic compound. For example, the yellow-green host can include, but is not limited to, at least one of the red host and/or the green host.

The yellow-green emitter can include at least one of yellow-green phosphorescent material, yellow-green fluorescent material and yellow-green delayed fluorescent material. In one embodiment, the yellow-green emitter can include, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetylacetonate)irdium(III) ($Ir(BT)_2(acac)$) Bis(2-(9,9-diethyl-fluoren-2-yl)-1-phenyl-1H-benzo[d]imdiazolato)(acetylacetonate)iridium(III) ($Ir(fbi)_2(acac)$), Bis(2-phenylpyridine)(3-(pyridine-2-yl)-2H-chromen-2-onate)iridium(III) (fac-$Ir(ppy)_2Pc$), Bis(2-(2,4-difluorophenyl)quinoline)(picolinate)iridium(III) (FPQIrpic), Bis(4-phenylthieno[3,2-c]pyridinato-N,C2') (acetylacetonate) iridium(III) (PO-01), the organic compound of the following Chemical Formula 2 and/or combinations thereof.

[Chemical Formula 2]

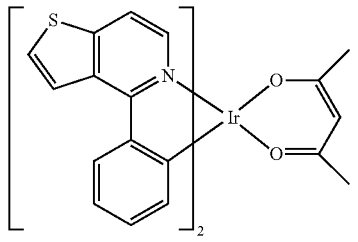

The contents of the yellow-green host in the third layer can be in a range between 50 wt % and 99 wt %, for example, between 80 wt % and 95 wt %, and the contents of the yellow-green emitter in the third layer can be in a range between 1 wt % and 50 wt %, for example, between 5 wt % and 20 wt %, but is not limited thereto. When the third layer includes both the P-type yellow-green host and the N-type yellow-green host, the P-type yellow-green host and the N-type yellow-green host can be mixed, but is not limited to, with a weight ratio between 4:1 to 1:4, for example, about 3:1 to 1:3.

The CGL1 370 includes a first N-type charge generation layer (N-CGL1) 375 disposed between the ETL1 350 and the HTL3 420 and a first P-type charge generation layer (P-CGL1) 380 disposed between the N-CGL1 375 and the HTL3 420. The CGL2 470 includes a second N-type charge generation layer (N-CGL2) 475 disposed between the ETL2 450 and the HTL4 520 and a second P-type charge generation layer (P-CGL2) 480 disposed between the N-CGL2 475 and the HTL4 520.

Each of the N-CGL1 375 and the N-CGL2 475 provides electrons to the EML1 340 in the first emitting part 300 and the EML2 440 in the second emitting part 400, respectively. Each of the P-CGL1 380 and the P-CGL2 480 provides holes to the EML2 440 in the second emitting part 500 and the EML3 540 in the third emitting part 500, respectively.

Each of the N-CGL1 375 and the N-CGL2 475 can be an organic layer including electron transporting material doped with an alkali metal such as Li, Na, K and Cs and/or an alkaline earth metal such as Mg, Sr, Ba and Ra. For example, the contents of the alkali metal and/or the alkaline earth metal in each of the N-CGL1 375 and the N-CGL2 475 can be, but is not limited to, between about 0.1 wt % and about 30 wt %, for example, about 1 wt % and about 10 wt %.

As an example, each of the N-CGL1 375 and the N-CGL2 475 can include an organic compound with one or more, for example, at least two phenanthroline moieties as a host and alkali metal such as Li as a dopant. Each of the phenanthroline moieties includes $sp^2$ unshared electron pairs for Li, and therefore, the N-CGLs 375 and 475 can secure and implement high electron generations in a low doping concentration and/or in a thin thickness.

In one embodiment, each of the P-CGL1 380 and the P-CGL2 480 can include, but is not limited to, inorganic material selected from the group consisting of $WO_x$, $MoO_x$, $Be_2O_3$, $V_2O_5$ and/or combinations thereof. In another embodiment, each of the P-CGL1 380 and the P-CGL2 480 can include organic material of the hole transporting material doped with the hole injecting material (e.g., organic material such as HAT-CN, F4-TCNQ and/or F6-TCNNQ and/or inorganic material such as $MgF_2$ and/or $CaF_2$). In this case, the contents of the hole injecting material in the P-CGL1 380 and the P-CGL2 480 can be, but is not limited to, between about 2 wt % and about 15 wt %.

As described above, as the reflector 240 is disposed under the first electrode 210, the first electrode 210 and the reflector 240 can function as a reflective electrode. In the OLED D, light loss at an interface of an emissive layer 230 of the organic material and the first electrode 210 where the light is reflected from the reflector 240 is caused by the surface plasmon polariton (SPP). Light loss owing to SPP is caused by electromagnetic waves transmitted at an interface between metal and dielectric, and a considerable amount of light is guided on the surface by free electrons of the metal, and finally 20 to 30% of light is extracted to the outside. Accordingly, light loss by SPP in the reflective electrode including the first electrode 210 and the reflector 240 located under the first electrode and including material having excellent reflective properties, such as silver (Ag) and/or APC, needs to be reduced.

In the present disclosure, the light loss by SPP can be reduced in the first electrode 210 and the reflector 240 functioning as the reflective electrode and microcavity effect can be maximized by controlling an optical distance or an optical thickness in the OLED D. Accordingly, the luminous efficiency, luminous luminance and luminous lifespan of the OLED can be improved and viewing angle and color gamut of the OLED can be improved.

In one embodiment, the HIL 310 can have a thickness between a range of, but is not limited to, 50 Å to 200 Å, for example, a range between 50 Å to 100 Å. In another embodiment, the HTL1 320 can have a thickness between a range of, but is not limited to, 1100 Å to 1400 Å, for example, a range between 1200 Å to 1300 Å. In another embodiment, the HTL2 330 can have a thickness between a range of, but is not limited to, 80 Å to 200 Å, for example, a range between 100 Å to 150 Å.

In another embodiment, a first distance d1 from a top surface of the first electrode 210 of a portion of the reflective electrode to a bottom surface of the EML1 340, i.e., to a top surface of the HTL2 330, can be in a range between 1400 Å and 1500 Å. When the distance d1 from the top surface of the first electrode 210 to the bottom surface of the EML1 340 is designed as such, the light loss caused by SPP at the interface between the first electrode 210 where the light is reflected from the reflector 240 and the emissive layer 230 is reduced.

In addition, there is a need to increase light amount emitted from the OLED D by increasing a micro-cavity effect as well as reducing the light loss by SPP. In order to implement such technical effects, a distance d2 from the bottom surface of the EML1 340 to a bottom surface of the EML2 440, i.e., to a top surface of the HTL3 420, a distance d12 from a top surface of the EML1 340 to the bottom surface of the EML2 440, a distance d3 from the bottom surface of the EML2 440 to a bottom surface of the EML3 540, i.e., to a top surface of the HTL4 520, a distance d13 from a top surface of the EML2 440 to the bottom surface of the EML3 540, a distance d4 from the bottom surface of the EML3 540 to a bottom surface of the second electrode 220, i.e., to a top surface of the EIL 560, and/or a total distance dT from the top surface of the first electrode 210 to the bottom surface of the second electrode 220 is set.

In one embodiment, the distance (first distance) d1 from a top surface of the first electrode 210 to a bottom surface of the EML1 340, the distance (second distance) d2 from the bottom surface of the EML1 340 to a bottom surface of the EML2 440, the distance (third distance) d3 from the bottom surface of the EML2 440 to a bottom surface of the EML3 540 and the distance (fourth distance) d4 from bottom surface of the EML3 540 to a bottom surface of the second electrode 220 can have a ratio of 3.0 to 3.75:1:2.0 to 2.75:1.5 to 2.25, for example, 3.0 to 3.5:1:2.0 to 2.5:1.5 to 2.0.

In one embodiment, the distance d2 from the bottom surface of the EML1 340 to the bottom surface of the EML2 440 can be in a range between 400 Å and 500 Å. In another embodiment, the distance d12 from the bottom surface of the ETL1 350 to the bottom surface of the EML2 440 can be in a range between 200 Å and 300 Å.

As an example, the EML1 340 can have a thickness T1 in a range between 150 Å to 250 Å, the ETL1 350 can have a thickness T2 in a range between 30 Å to 100 Å, the N-CGL1 375 can have a thickness in a range between 50 Å to 100 Å, the P-CGL1 380 can have a thickness in a range between 50 Å to 80 Å, and the HTL3 420 can have a thickness T4 in a range between 30 Å to about 70 Å, but is not limited thereto. In another embodiment, the EML1 340 can have the thickness T1 equal to or greater than the thickness T3 of the CGL1 370. In another embodiment, the CGL1 370 can have the thickness T3 equal to or greater than a sum of the thickness T2 of the ETL1 50 and the thickness T4 of the HTL3 420.

When the distance d2 from the bottom surface of the EML1 340 to the bottom surface of the EML2 440 and/or the distance d12 from the bottom surface of the ETL1 350 to the bottom surface of the EML2 440 satisfy the above ranges, the micro-cavity effect can be increased without any electrical disadvantages. In addition, wherein the CGL1 370 has the thickness T3 equal to or greater than the sum of the thickness T1 and T2 of the ETL1 350 and the HTL3 420, the luminous efficiency and the luminous lifespan of the OLED D can be increased.

In another embodiment, the distance d3 from the bottom surface of the EML2 440 to the bottom surface of the EML3 540 can be in a range between 1000 Å and 1100 Å. In addition, the distance d13 from the top surface of the EML2 440, i.e., a bottom surface of the ETL2 450, to the bottom surface of the EML3 540 can be in a range between 550 Å and 650 Å.

As an example, the first layer 440A can have a thickness in a range between 250 Å to 350 Å, the second layer 440B can have a thickness in a range between 100 Å to 250 Å, the ETL2 450 can have a thickness in a range between 100 Å to 150 Å, the N-CGL2 475 can have a thickness in a range between 110 Å to 170 Å, and the P-CGL2 480 can have a thickness in a range between 60 Å to 120 Å, but is not limited thereto.

In another embodiment, the EML2 440 can have the thickness equal to or greater than the thickness of the CGL2 470. The CGL2 470 can have the thickness equal to or greater than the thickness of the ETL2 450 and/or equal to or less than the thickness of the HTL4 520. As an example, the CGL2 470 can have the thickness in a range between 200 Å to 250 Å and the HTL4 520 can have the thickness of more than 250 Å to 300 Å, but is not limited thereto.

When the distance d3 from the bottom surface of the EML2 440 to the bottom surface of the EML3 540 and/or the distance d13 from the bottom surface of the ETL2 450 to the bottom surface of the EML2 440 satisfy the above ranges, the OLED D can secure beneficial electrical properties and viewing angle.

In another embodiment, the distance d4 from the bottom surface of the EML3 540 to the bottom surface of the second electrode 220 can be in a range between 750 Å and 850 Å. As an example, the EML3 540 can have a thickness in a range between 250 Å to 350 Å, the ETL3 550 can have a thickness in a range between 200 Å to 250 Å, and the EIL 560 can have a thickness in a range between 250 Å to 350 Å, but is not limited thereto.

When the distance d4 from the bottom surface of the EML3 540 to the bottom surface of the second electrode 220 satisfies the above range, the OLED can increase viewing angle and can secure beneficial optical properties.

In another embodiment, the total distance dT from the top surface of the first electrode 210 of a portion of the reflective electrode to the bottom surface of the second electrode 220 of the transmissive electrode can be in a range between 3550 Å and 3950 Å so that the OLED D can maximize the micro-cavity effect, but is not limited thereto.

In the OLED D with plural emitting parts, the distance d1 from the top surface of the first electrode 210 of a portion of the reflective electrode of the bottom surface of the EML1 340, the distance d2 from the bottom surface of the EML1 340 to the bottom surface of the EML2 440 and/or the distance d12 from the top surface of the EML1 340 to the bottom surface of the EML2 440, the distance d3 from the bottom surface of the EML2 440 to the bottom surface of the EML3 540 and/or the distance d13 from the top surface of the EML2 440 to the bottom surface of the EML 540, the distance d4 from the bottom surface of the EML3 540 to the bottom surface of the second electrode 220 and/or the distance dT from the top surface of the first electrode 210 to the bottom surface of the second electrode d4 are controlled, and thus, light loss caused by SPP can be reduced and the micro-cavity effect can be increased. Accordingly, the luminous efficiency, luminous luminance, luminous lifespan, viewing angle and/or color gamut of the OLED can be improved.

Example 1 (Ex. 1): Design of OLED

An organic light emitting diode of three emitting parts having the following stacked structure was designed.

Reflector (Ag alloy, 1000 Å); anode (ITO, 100 Å); hole injection layer (HIL, 70 Å); first hole transport layer (HTL1, 1250 Å); second hole transport layer (HTL3, 130 Å), first emitting material layer (first blue emitting material layer, B-EML1, 200 Å); first electron transport layer (ETL1, 60 Å); first N-type charge generation layer (N-CGL1, 80 Å); first P-type charge generation layer (P-CGL1, 65 Å); third hole transport layer (HTL3, 50 Å); green emitting material layer of second emitting material layer (G-EML, 300 Å); red emitting material layer of second emitting material layer (R-EML, 150 Å); second electron transport layer (ETL2, 120 Å); second N-type charge generation layer (N-CGL2, 140 Å); second P-type charge generation layer (P-CGL2, 90 Å); fourth hole transport layer (HTL4, 255 Å); third emitting material layer (second blue emitting material layer, B-EML2, 290 Å), third electron transport layer (ETL3, 220 Å); an electron injection layer (EIL, 300 Å); cathode (IZO, 300 Å); and CPL (1050 Å).

The distance (ITO~HTL2) from the top surface of the anode of the reflective electrode to the bottom surface of the B-EML1 (the top surface of the HTL2) is 1450 Å, the distance from the bottom surface of the B-EML1 to the bottom surface of the second emitting material layer (top surface of the HTL3) is 455 Å, the distance (ETL1~HTL3) from the bottom surface of the ETL1 to the bottom surface of the second emitting material layer (the top surface of the HTL3) is 255 Å, the distance from the bottom surface of the second emitting material layer to the bottom surface of the third emitting material layer is 1055 Å, the distance (ETL2~HTL4) from the bottom surface of the ETL2 to the bottom surface of the third emitting material layer (top surface of the HTL4) is 605 Å, the distance from the bottom surface of the third emitting material layer to the bottom surface of the cathode of the transmissive electrode is 810 Å, and the distance from the top surface of the anode to the bottom surface of the cathode is 3770 Å.

Example 2 (Ex. 2): Design of OLED

An OLED was designed using the same structure as Example 1, except that the distance from ETL2 to HTL4 was set to 570 Å instead of 605 Å.

Experimental Example 1: Measurement of Luminous Properties of OLEDs

Figure 4:
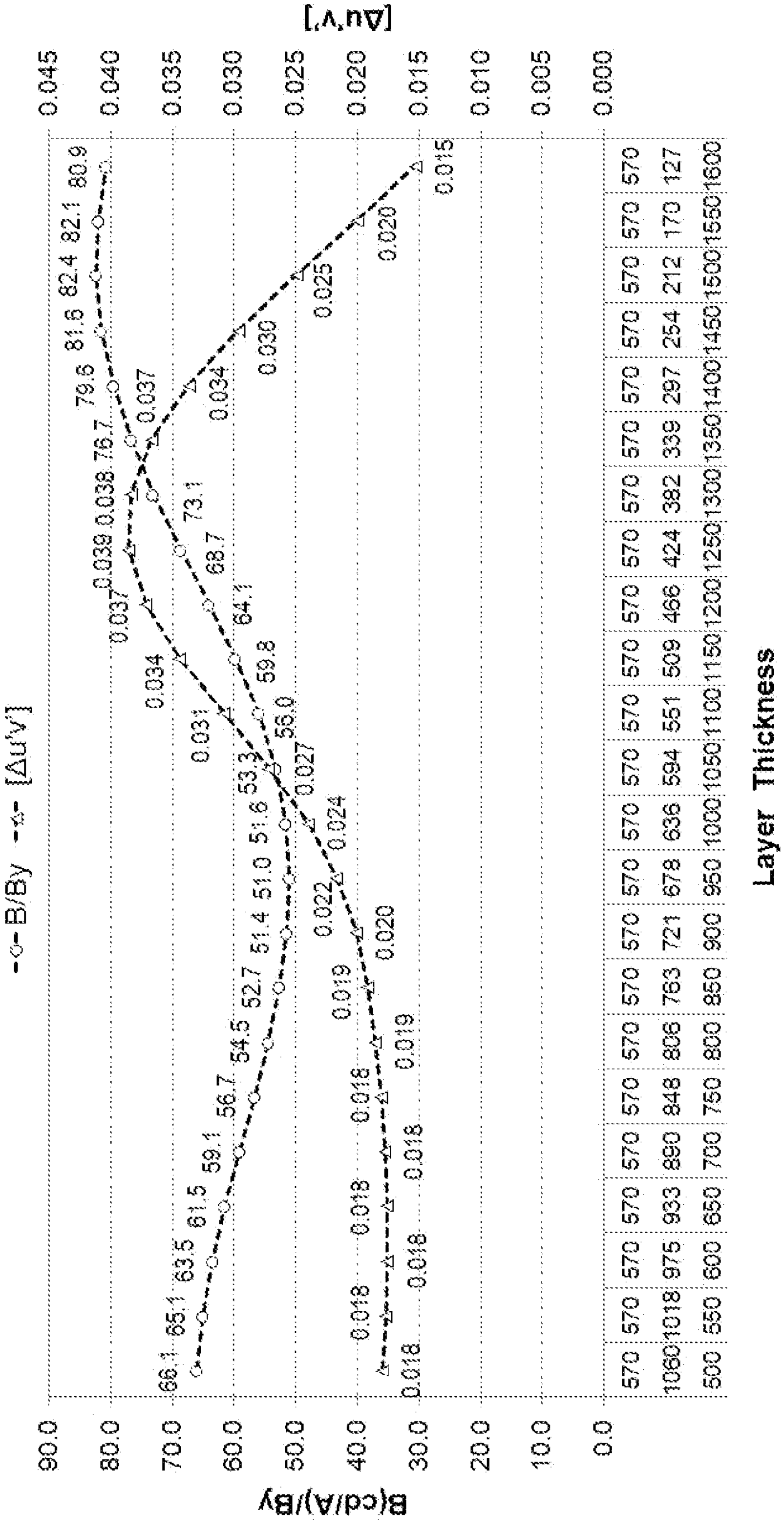
FIG. 4 illustrates a simulation result showing the changes of blue emission efficiency and viewing angles by the distances among the ITO electrode and the organic layers and among the organic layers in accordance with one example where the distance between the ETL2 and the HTL4 is set to a particular value.

The luminous or optical properties for the OLED designed in Example 2 were evaluated. Particularly, the blue luminous efficiency (current efficiency cd/A divided by blue light coordinate By of Y-axis), and color viewing angle (A u' v', 60°) change were evaluated by the distances of ITO~HTL2 and ETL1~HTL3. The evaluation results are illustrated in FIG. 4. As illustrated in FIG. 4, the blue luminous efficiency was maximized and color viewing angle change was minimized when the distance of ITO~HTL2 is between 1400 Å and 1500 Å and the distance of ETL1~HTL3 is between 200 Å and 300 Å.

Figure 5:
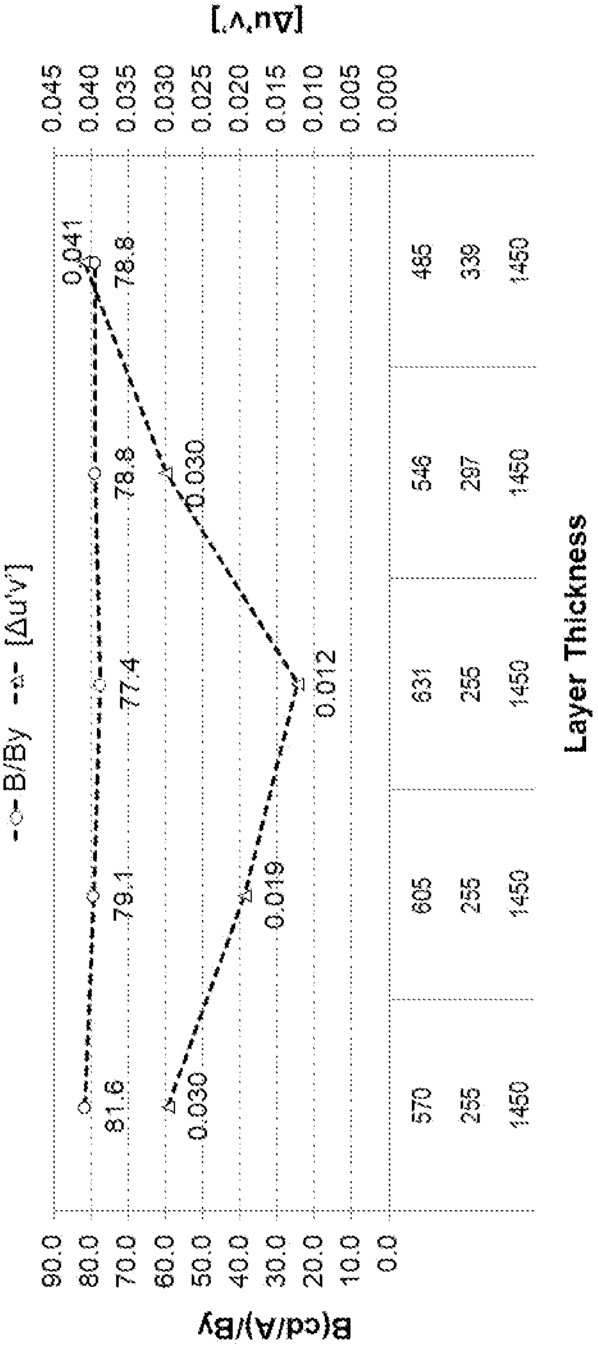
FIG. 5 illustrates a simulation result showing the changes of blue emission efficiency and viewing angles by the distances among the organic layers in accordance with another example where the distance between the ITO electrode and the organic layer is set to a particular value.
Figure 6A:
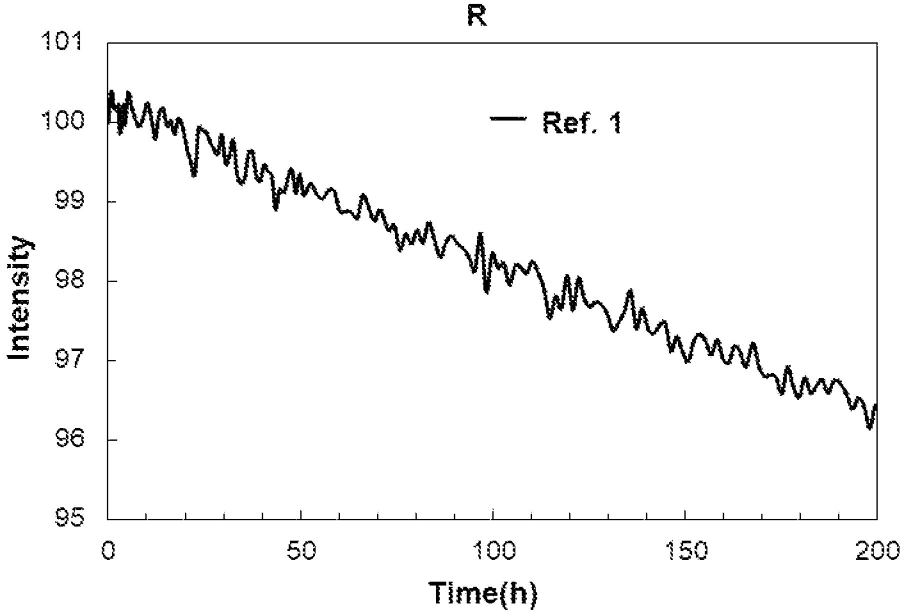
FIGS. 6A to 6D illustrate evaluation results of luminous intensity changes and voltage change by time in an organic light emitting diode fabricated in one Comparative Example.
Figure 6B:
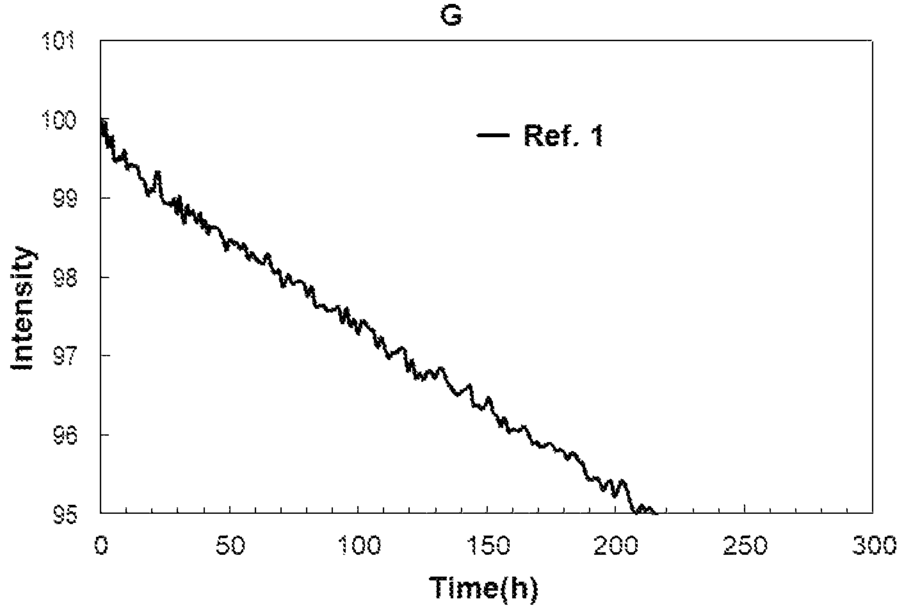
Figure 6C:
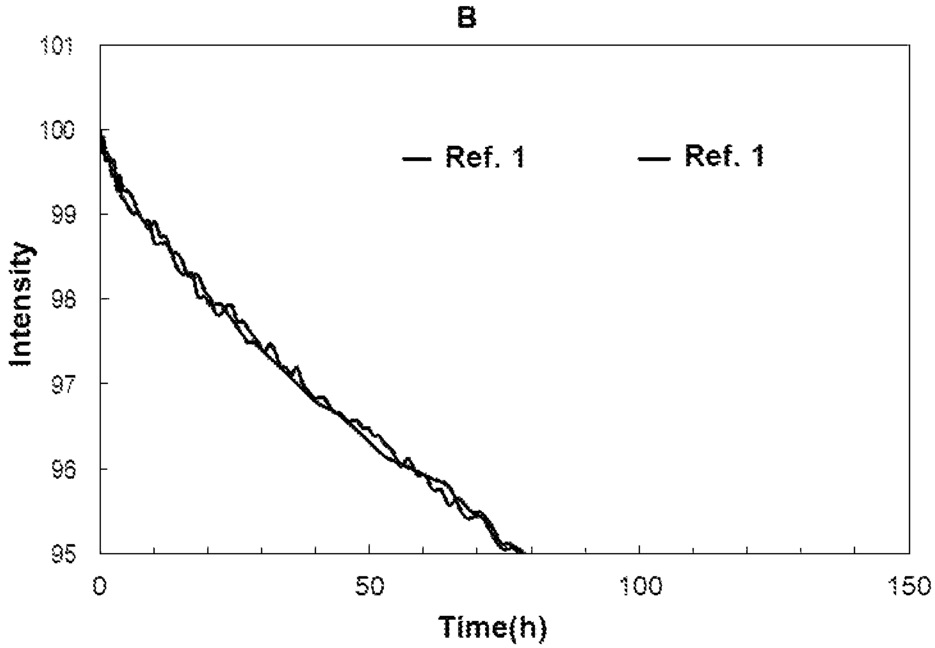
Figure 6D:
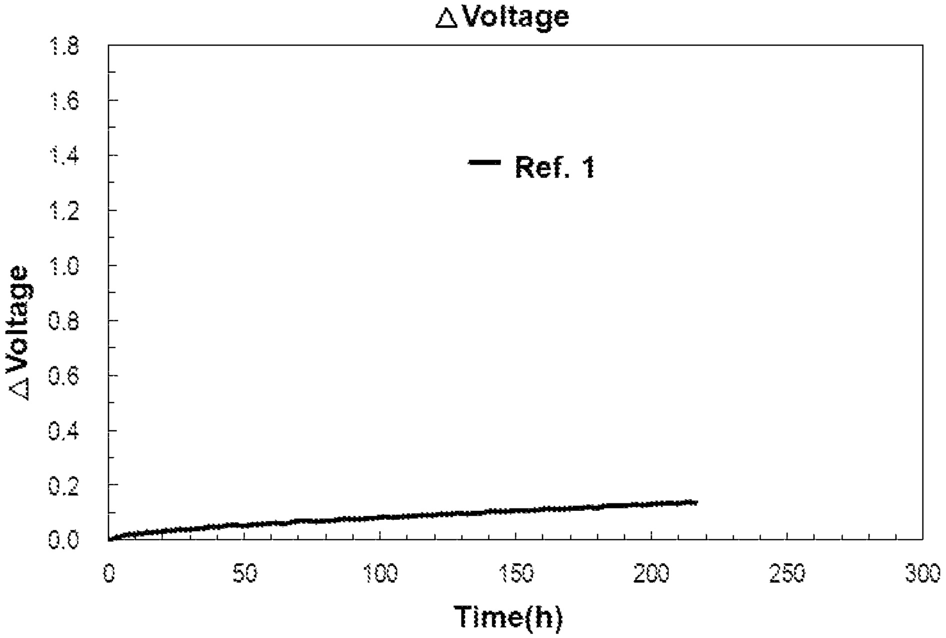
Figure 7A:
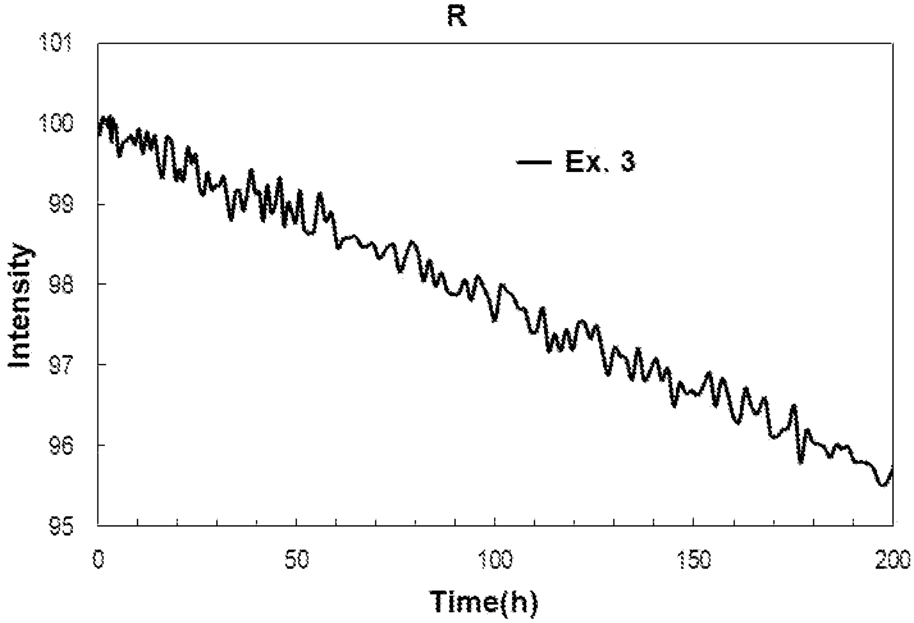
FIGS. 7A to 7D illustrate evaluation results of luminous intensity changes and voltage change by time in an organic light emitting diode fabricated in one Example.
Figure 7B:
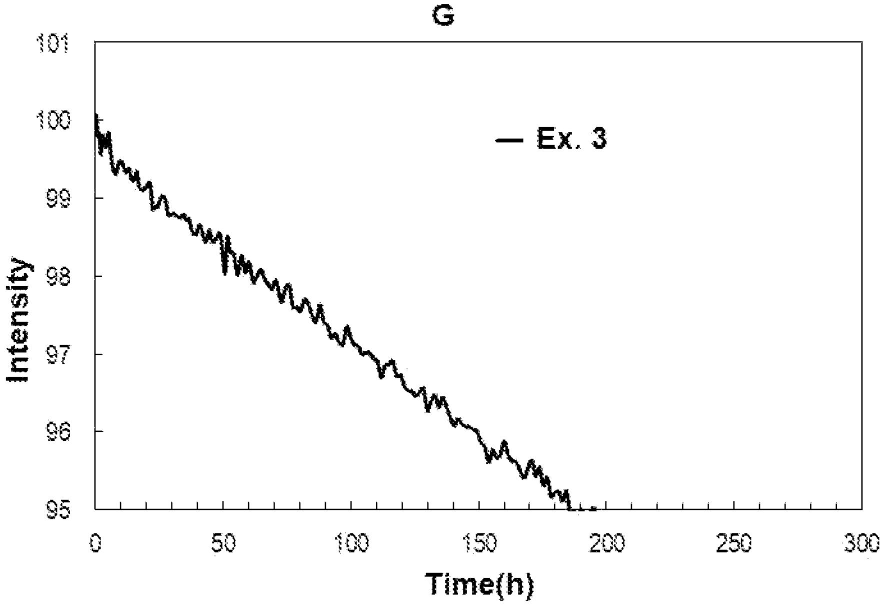
Figure 7C:
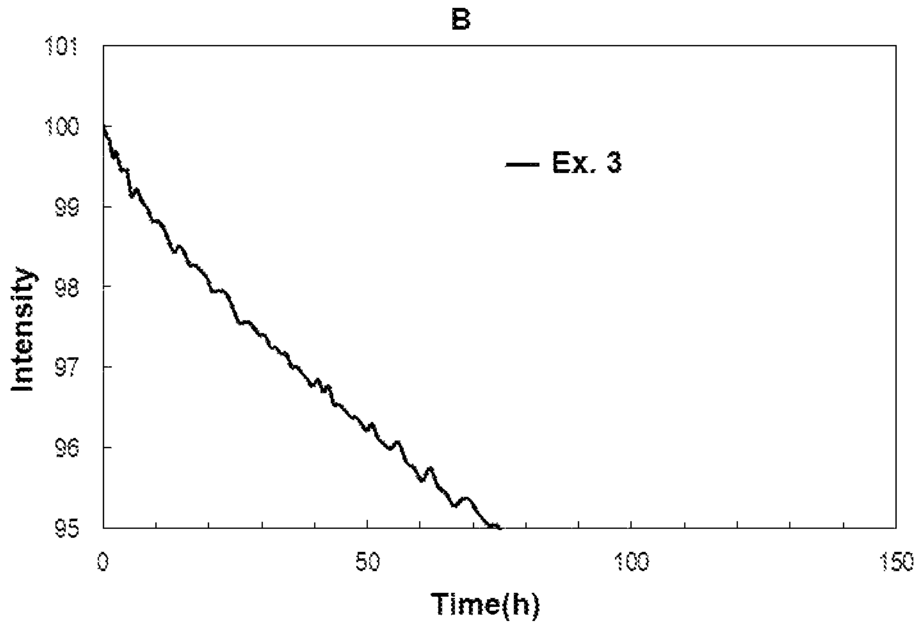
Figure 7D:
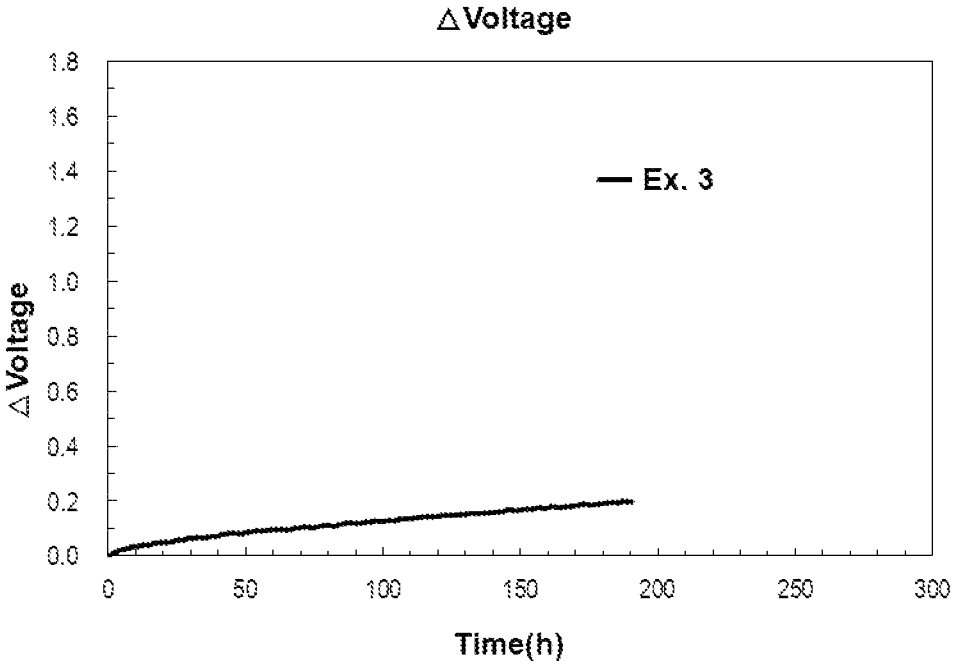
Figure 8A:
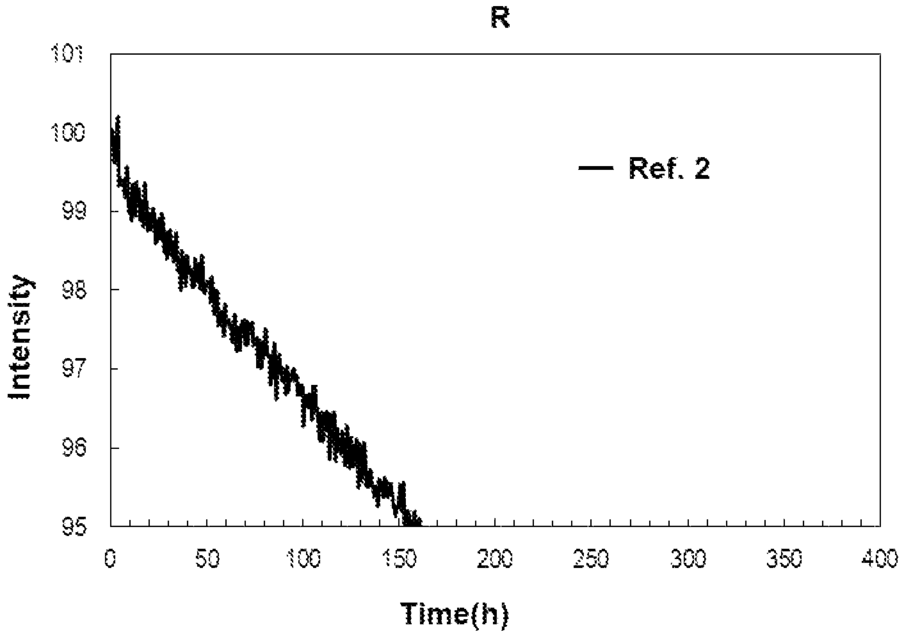
FIGS. 8A to 8D illustrate evaluation results of luminous intensity changes and voltage change by time in an organic light emitting diode fabricated in another Comparative Example.
Figure 8B:
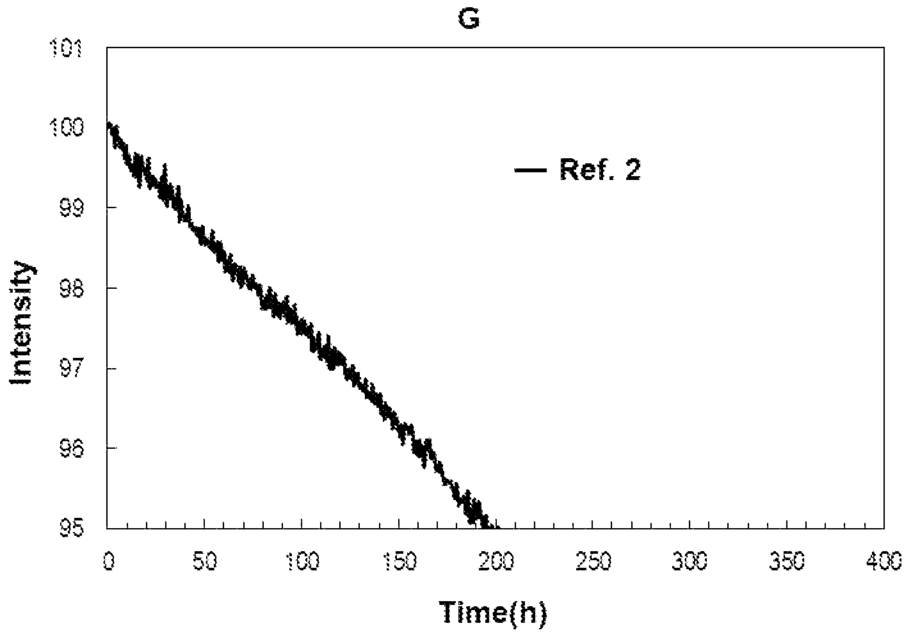
Figure 8C:
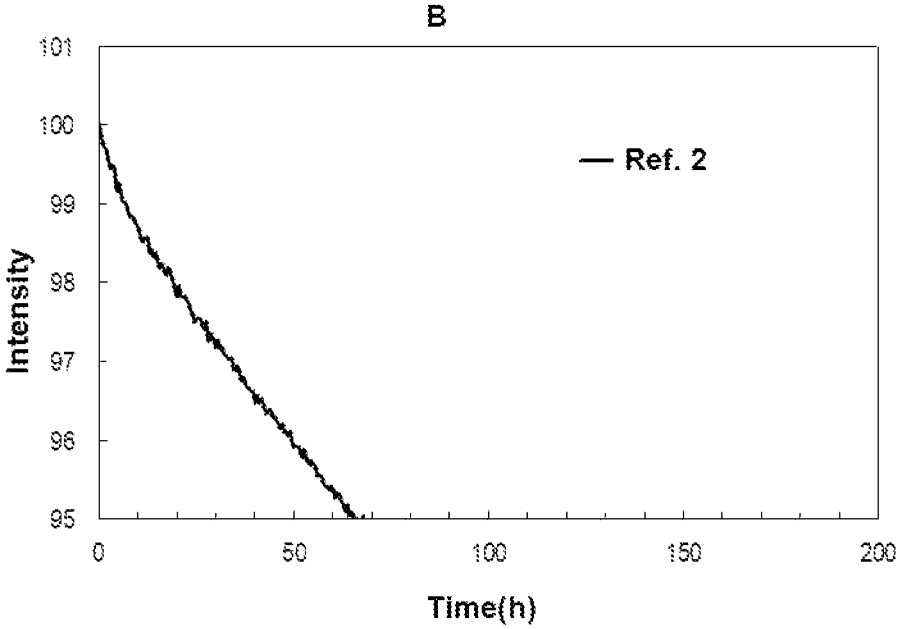
Figure 8D:
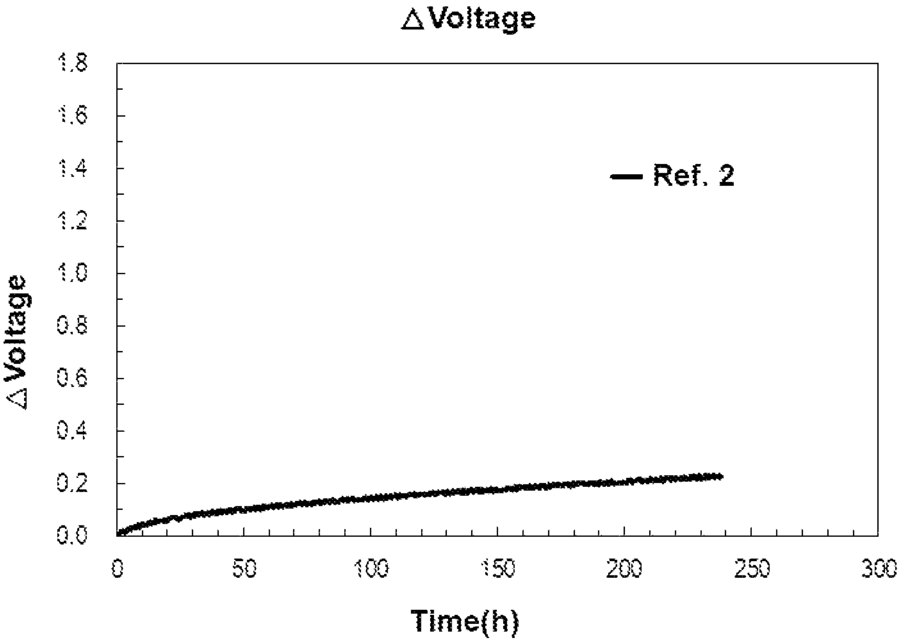
Figure 9A:
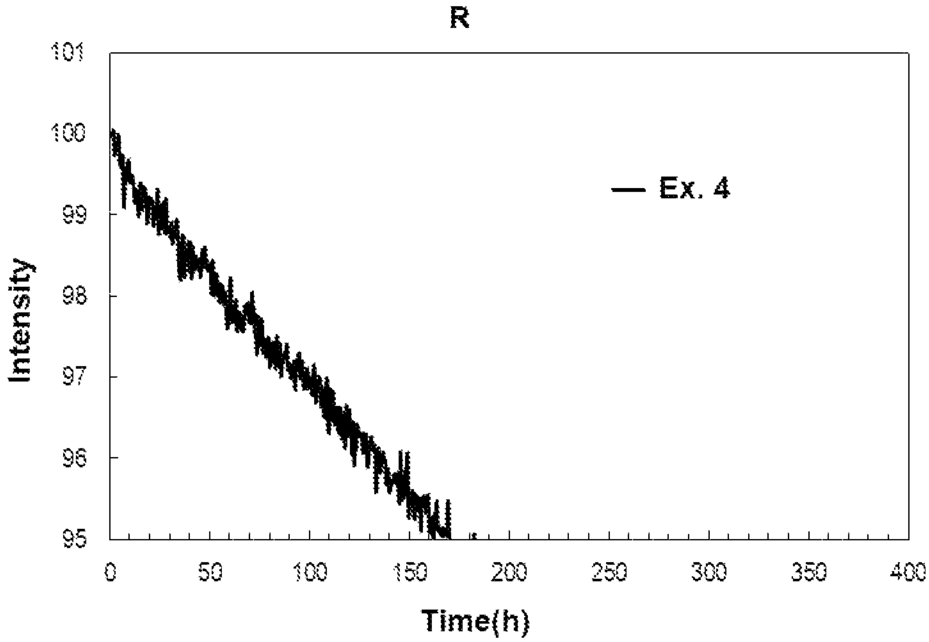
FIGS. 9A to 9D illustrate evaluation results of luminous intensity changes and voltage change by time in an organic light emitting diode fabricated in another Example.
Figure 9B:
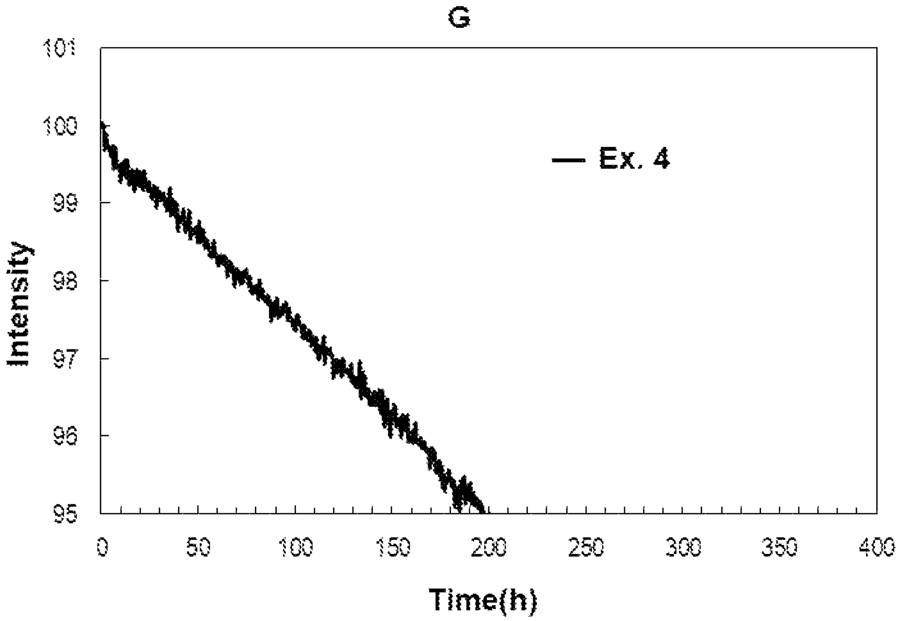
Figure 9C:
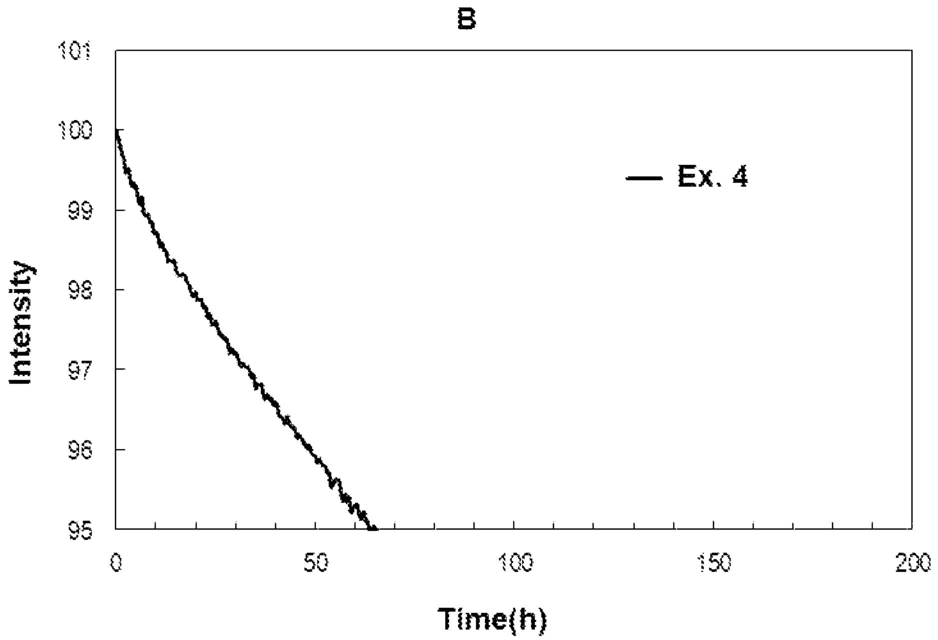
Figure 9D:
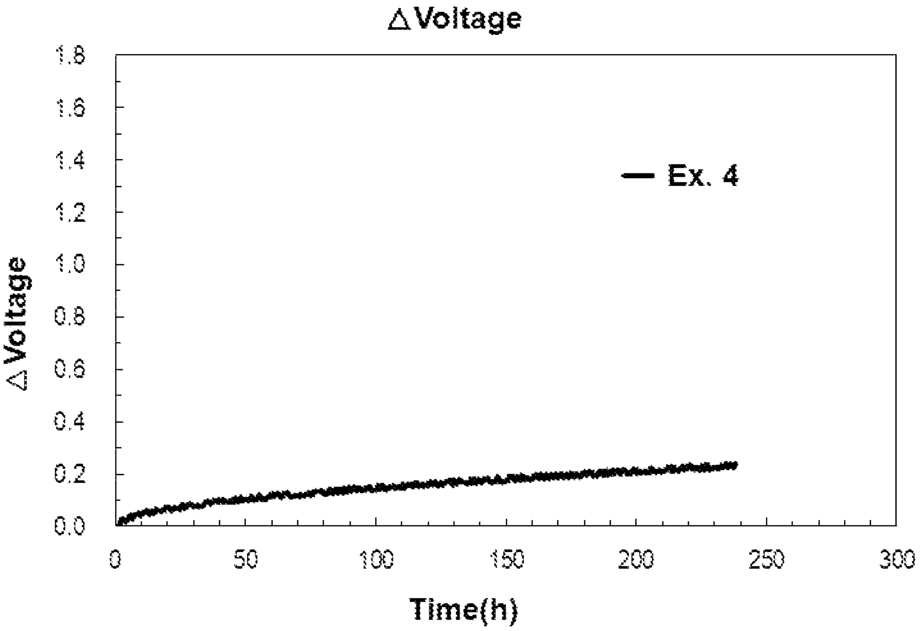
Figure 10A:
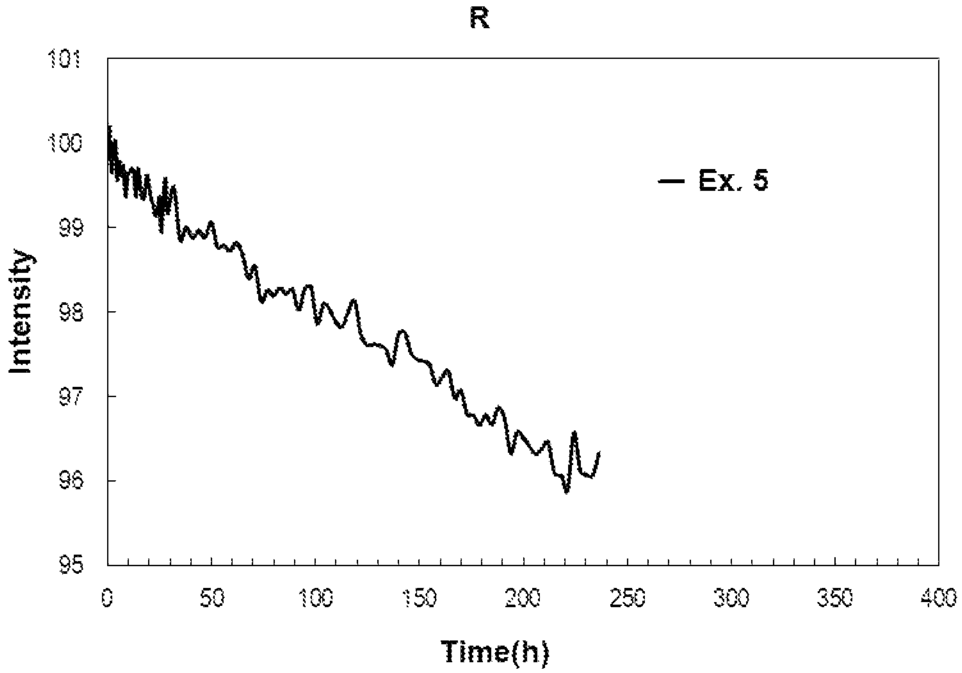
FIGS. 10A to 10D illustrate evaluation results of luminous intensity changes and voltage change by time in an organic light emitting diode fabricated in another Example.
Figure 10B:
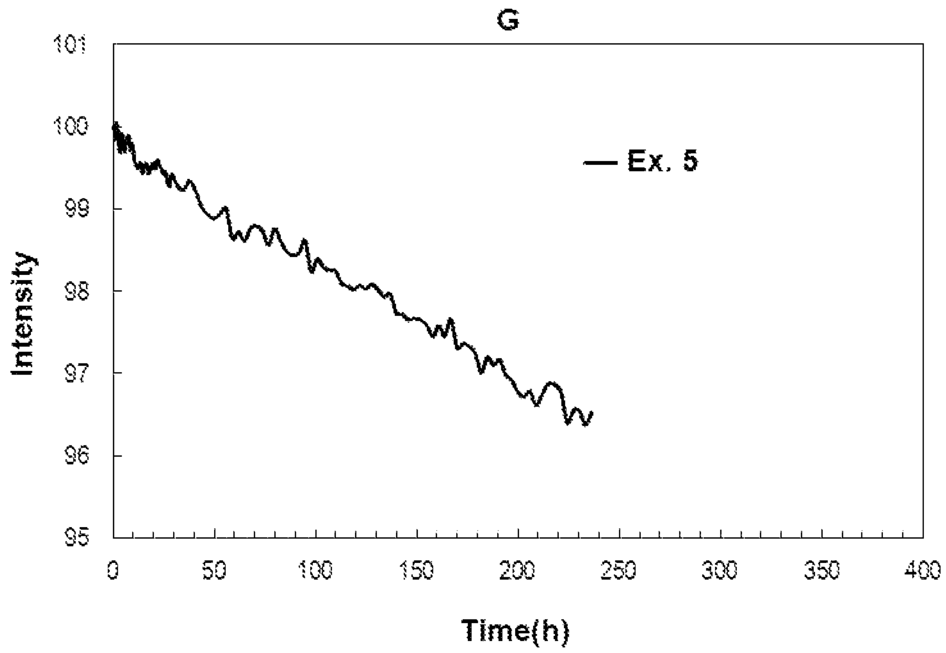
Figure 10C:
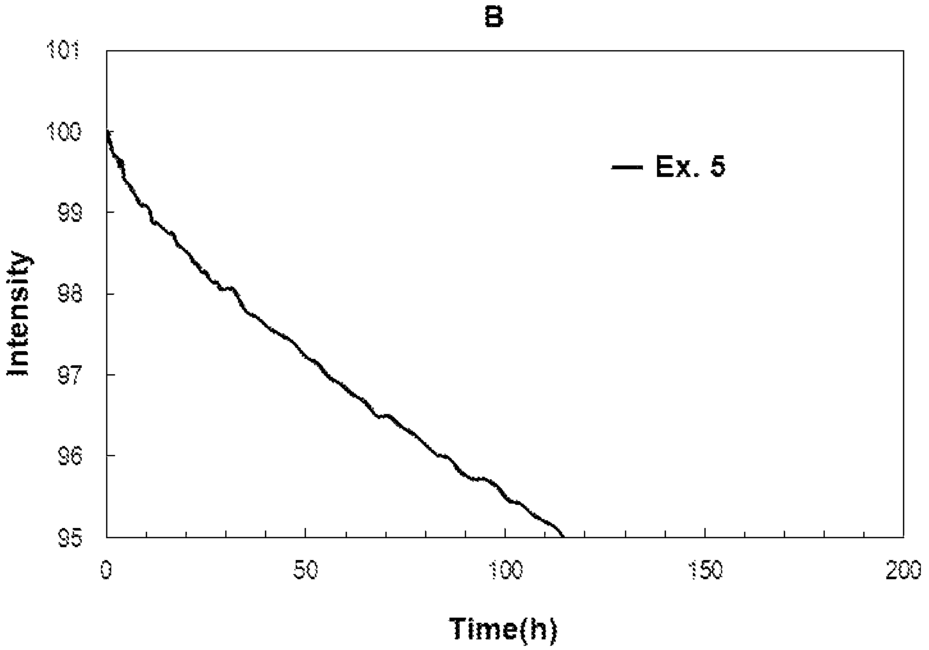
Figure 10D:
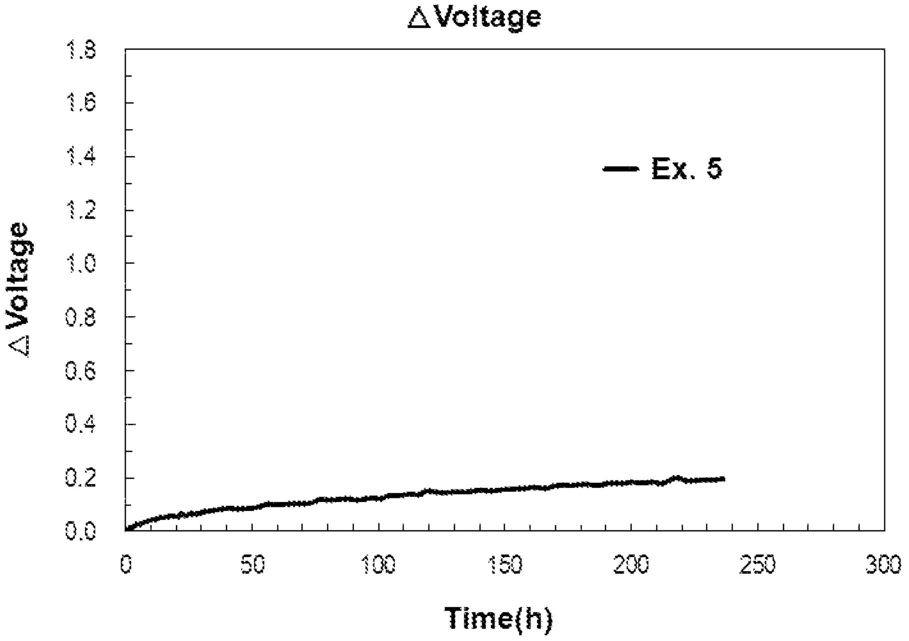

Moreover, the blue luminous efficiency and the color viewing angle change by the distances of ETL1~HTL3 and ETL2~HTL4 were evaluated in the OLED designed in Example 1, where the distance of ITO~HTL2 was set to 1450 Å. The evaluation results are illustrated in FIG. 5. As illustrated in FIG. 5, the blue luminous efficiency was maximized and color viewing angle change was minimized when the distance of ETL1~HTL3 is between 255 Å and 297 Å and the distance of ETL2~HTL4 is between 570 Å and 631 Å, particularly 605 Å and 631 Å.

Example 3 (Ex. 3): Design of OLED

An OLED was designed using the same structure as Example 1, except that the distance from the top surface of the anode to the bottom surface of the first emitting material layer (ITO~HTL2) was set to 1400 Å instead of 1450 Å.

Comparative Example 1 (Ref. 1): Design of OLED

An OLED was designed using the same structure as Example 1, except that the distance from the top surface of the anode to the bottom surface of the first emitting material layer (ITO~HTL2) was set to 500 Å instead of 1450 Å.

Experimental Example 2: Measurement of Luminous Properties of OLEDs

The luminous or optical properties for the OLEDs designed in Example 3 and Comparative Example 1 were evaluated. Particularly, current efficiencies (cd/A) of red (R) light, green (G) light, blue (B) light and white (W) light at a maximum current density, color coordinates of red (R) light, green (G) light, blue light (B) and white (W) light at a maximum current density, Blue Index (B/By, BI), current efficiency of blue light divided by By, panel luminance (transparent 16-19 GB ACL standard), color gamut (overlapping ratio, CCT (Correlated color temperature), DCI, BT202002) were evaluated as a relative value of the OLED designed in Comparative Example 1. The evaluation results are illustrated in the following Table 1 as well as FIGS. 6A to 7D.

TABLE 1

Luminous Properties of OLED

| Sample | | Ref. 1 | Ex. 3 |
|---|---|---|---|
| Anode ~ B EML1 Distance | | 500Å | 1400Å |
| Efficiency | R | 100% | 99% |
| (cd/A) | G | 100% | 98% |
| @ full | B | 100% | 116% |
| | W | 100% | 101% |
| Color | Rx | 0.67 | 0.669 |
| Coordinates | Ry | 0.329 | 0.329 |
| | Gx | 0.286 | 0.286 |
| | Gy | 0.652 | 0.645 |
| | Bx | 0.140 | 0.139 |
| | By | 0.050 | 0.050 |
| | Wx | 0.316 | 0.303 |
| | Wy | 0.342 | 0.320 |
| VA (@Max) | | 0.019 | 0.019 |
| B/By (BI) | | 100% | 116% |
| Panel | R | 100% | 99% |
| Luminance | G | 100% | 98% |
| (F/W) | B | 100% | 118% |
| | W | 100% | 123% |
| Color Gamut | CCT | 6,244 | 7,161 |
| (Overlapping Ratio) | DCI | 94.4 | 93.7 |
| | BT2020 | 70.3 | 69.9 |

As indicated in Table 1 and FIGS. 6A, 6B, 6C, 6D, 7A, 7B, 7C, and 7D, compared to the OLED designed in Comparative Example 1, in the OLEDs designed in Example 3, the blue efficiency and the white efficiency was improved, and therefore, the blue index taking the color coordinates into account was improved by 16.4%. As the thickness of the CGL was controlled, the OLED designed in Example 3 secured equivalent luminous lifespan and viewing angle property. Compared to the OLED designed in Comparative Example 1, in the OLED designed in Ex. 3, the blue luminance was improved by 17.6% and white luminance was improved by 22.6% as CCT increases.

Comparative Example 2 (Ref. 2): Design of OLED

An OLED was designed using the same structure as Example 1, except that the thickness of HTL3 was set to 40 Å instead of 50 Å, the thickness of N-CGL1 was set to 130 Å instead of 80 Å and the thickness of P-CGL1 was 75 Å instead of 65 Å.

Example 4 (Ex. 4): Design of OLED

An OLED was designed using the same structure as Example 1, except that the thickness of HTL3 was set to 40 Å instead of 50 Å, the thickness of N-CGL1 was set to 100 Å instead of 80 Å and the thickness of P-CGL1 was 75 Å instead of 65 Å.

Example 5 (Ex. 5): Design of OLED

An OLED was designed using the same structure as Example 1, except that the thickness of HTL3 was set to 40 Å instead of 50 Å, the thickness of N-CGL1 was set to 80 Å and the thickness of P-CGL1 was 75 Å instead of 65 Å.

Experimental Example 3: Measurement of Luminous Properties of OLEDs

The luminous or optical properties for the OLEDs designed in Examples 3-4 and Comparative Example 2 were evaluated as a relative value of the OLED designed in Comparative Example 2, as Experimental Example 2. The luminous lifespan was evaluated at 40° C. and 40 J. The evaluation results are illustrated in the following Table 2 as well as FIGS. 8A, 8B, 8C, 8D, 9A, 9B, 9C, 9D, 10A, 10B, 10C, and 10D.

TABLE 2

Luminous Properties of OLED

| Sample | | Ref. 2 | Ex. 4 | Ex. 5 |
|---|---|---|---|---|
| P-CGL | | 75Å | ← | ← |
| N-CGL | | 130Å | 100Å | 80Å |
| Efficiency | R | 100% | 100% | 102% |
| (cd/A) | G | 100% | 102% | 101% |
| @ full | B | 100% | 101% | 100% |
| | W | 100% | 101% | 101% |
| Color | Wx | 0.288 | 0.287 | 0.288 |
| Coordinates | Wy | 0.304 | 0.301 | 0.300 |
| VA (@Max) | | 00.02 | 0.018 | 0.02 |
| V (100 mA) | | 14.91 | 14.78 | 14.91 |
| EQE | | 100% | 101% | 101% |
| B intensity | | 0.57 | 0.569 | 0.570 |
| YG Intensity | | 0.164 | 0.166 | 0.164 |
| B Index | | 100% | 103% | 103% |
| Lifespan | R | 100% | 103% | 102% |
| | G | 100% | 103% | 108% |
| | B | 100% | 100% | 102% |

As illustrated in Table 2 and FIGS. 8A, 8B, 8C, 8D, 9A, 9B, 9C, 9D, 10A, 10B, 10C, and 10D, compared to the OLED designed in Comparative Example 2, in the OLEDs designed in Examples 4 to 5, where the thickness of total CGL1 including the N-CGL1 and the P-CGL1 was designed to be equal to or less than the thickness of the B-EML1, the luminous efficiency and the luminous lifespan was further improved.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

What is claimed is:

1. An organic light emitting diode, comprising:

a reflective electrode;

a transmissive electrode facing the reflective electrode; and an emissive layer between the reflective electrode and the transmissive electrode, the emissive layer including:

a first emitting part between the reflective electrode and the transmissive electrode, the first emitting part comprising a first emitting material layer;

a second emitting part between the first emitting part and the transmissive electrode, the second emitting part comprising a second emitting material layer;

a third emitting part between the second emitting part and the transmissive electrode, the third emitting part comprising a third emitting material layer;

a first charge generation layer between the first emitting part and the second emitting part; and a second charge generation layer between the second emitting part and the third emitting part, wherein a first distance from a top surface of the reflective electrode to a bottom surface of the first emitting material layer, a second distance from the bottom surface of the first emitting material layer to a bottom surface of the second emitting material layer, a third distance from the bottom surface of the second emitting material layer to a bottom surface of the third emitting material layer, and a fourth distance from the bottom surface of the third emitting material layer to a bottom surface of the transmissive electrode have a ratio of 3.0 to 3.75:1:2.0 to 2.75:1.5 to 2.25.

2. The organic light emitting diode of claim 1, wherein the first distance is in a range between 1400 Å and 1500 Å.

3. The organic light emitting diode of claim 1, wherein the second distance is in a range between 400 Å and 500 Å.

4. The organic light emitting diode of claim 1, wherein the third distance is in a range between 1000 Å and 1100 Å.

5. The organic light emitting diode of claim 1, wherein the fourth distance is in a range between 750 Å and 850 Å.

6. The organic light emitting diode of claim 1, wherein the first emitting part further comprises a first electron transport layer between the first emitting material layer and the first charge generation layer, and a distance from a bottom surface of the first electron transport layer to the bottom surface of the second emitting material layer is in a range between 200 Å and 300 Å.

7. The organic light emitting diode of claim 1, wherein the second emitting part further comprises a second electron transport layer between the second emitting material layer and the second charge generation layer, and a distance from a bottom surface of the second electron transport layer to the bottom surface of the third emitting material layer is in a range between 550 Å and 650 Å.

8. The organic light emitting diode of claim 1, wherein the first emitting material layer has a thickness greater than or equal to a thickness of the first charge generation layer.

9. The organic light emitting diode of claim 6, wherein the second emitting part further comprises a hole transport layer between the first charge generation layer and the second emitting material layer, and the first charge generation layer has a thickness greater than or equal to a sum of a thickness of the first electron transport layer and a thickness of the hole transport layer.

10. The organic light emitting diode of claim 1, wherein each of the first emitting material layer and the third emitting material layer comprises a blue emitting material layer, and the second emitting material layer comprises a red emitting material layer and a green emitting material layer.

11. An organic light emitting diode, comprising:

a reflective electrode;

a transmissive electrode facing the reflective electrode; and an emissive layer between the reflective electrode and the transmissive electrode, the emissive layer including:

a first emitting part between the reflective electrode and the transmissive electrode, the first emitting part comprising a first emitting material layer;

a second emitting part between the first emitting part and the transmissive electrode;

a third emitting part disposed between the second emitting part and the transmissive electrode;

a first charge generation layer between the first emitting part and the second emitting part; and a second charge generation layer between the second emitting part and the third emitting part, wherein a distance between a top surface of the reflective electrode and a bottom surface of the first emitting material layer is in a range between 1400 Å and 1500 Å.

12. The organic light emitting diode of claim 11, wherein the second emitting part comprises a second emitting material layer, and a distance from the bottom surface of the first emitting material layer to a bottom surface of the second emitting material layer is in a range between 400 Å and 500 Å.

13. The organic light emitting diode of claim 12, wherein the third emitting part comprises a third emitting material layer, and a distance from the bottom surface of the second emitting material layer to a bottom surface of the third emitting material layer is in a range between 1000 Å and 1100 Å.

14. The organic light emitting diode of claim 13, wherein a distance from the bottom surface of the third emitting material layer to a bottom surface of the transmissive electrode is in a range between 750 Å and 850 Å.

15. The organic light emitting diode of claim 12, wherein the first emitting part further comprises a first electron transport layer between the first emitting material layer and the first charge generation layer, and a distance from a bottom surface of the first electron transport layer to the bottom surface of the second emitting material layer is in a range between 200 Å and 300 Å.

16. The organic light emitting diode of claim 13, wherein the second emitting part further comprises a second electron transport layer between the second emitting material layer and the second charge generation layer, and a distance from a bottom surface of the second electron transport layer to the bottom surface of the third emitting material layer is in a range between 550 Å and 650 Å.

17. The organic light emitting diode of claim 11, wherein the first emitting material layer has a thickness greater than a thickness of the first charge generation layer.

18. The organic light emitting diode of claim 15, wherein the second emitting part further comprises a hole transport layer between the first charge generation layer and the second emitting material layer, and the first charge generation layer has a thickness greater than or equal to a sum of a thickness of the first electron transport layer and a thickness of the hole transport layer.

19. The organic light emitting diode of claim 13, wherein each of the first emitting material layer and the third emitting material layer comprises a blue emitting material layer, and the second emitting material layer comprises a red emitting material layer and a green emitting material layer.

20. An organic light emitting device, comprising:

a substrate; and the organic light emitting diode of claim 1 over the substrate.

21. An organic light emitting device, comprising:

a substrate; and the organic light emitting diode of claim 11 over the substrate.

22. An organic light emitting diode, comprising:

a reflective electrode;

a first emitting part on the reflective electrode, the first emitting part comprising a first emitting material layer configured to emit blue light;

a first charge generation layer on the first emitting part;

a second emitting part on the first charge generation layer, the second emitting part including a second emitting material layer comprising a red emitting material layer configured to emit red light and a green emitting material layer configured to emit green light, the green emitting material layer on the red emitting material layer;

a second charge generation layer on the second emitting part;

a third emitting part on the second charge generation layer, the third emitting part including a third emitting material layer configured to emit the blue light; and a transmissive electrode on the third emitting part, wherein a distance between a top surface of the reflective electrode and a bottom surface of the first emitting material layer is in a range between 1400 Å and 1500 Å.

23. The organic light emitting diode of claim 22, wherein a distance from the bottom surface of the first emitting material layer to a bottom surface of the second emitting material layer is in a range between 400 Å and 500 Å, a distance from the bottom surface of the second emitting material layer to a bottom surface of the third emitting material layer is in a range between 1000 Å and 1100 Å, and a distance from the bottom surface of the third emitting material layer to a bottom surface of the transmissive electrode is in a range between 750 Å and 850 Å.

24. The organic light emitting diode of claim 22, wherein the first emitting part further comprises a first electron transport layer between the first emitting material layer and the first charge generation layer, and a distance from a bottom surface of the first electron transport layer to the bottom surface of the second emitting material layer is in a range between 200 Å and 300 Å.

25. The organic light emitting diode of claim 22, wherein the second emitting part further comprises a second electron transport layer between the second emitting material layer and the second charge generation layer, and a distance from a bottom surface of the second electron transport layer to the bottom surface of the third emitting material layer is in a range between 550 Å and 650 Å.

* * * * *